(12) United States Patent
Hong et al.

(10) Patent No.: US 12,096,610 B2
(45) Date of Patent: Sep. 17, 2024

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Hee Bum Hong, Hwaseong-si (KR); Heesung Shin, Hwaseong-si (KR); Hojoon Lee, Yongin-si (KR); Younghun Jung, Seoul (KR); Chang-Min Hong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 568 days.

(21) Appl. No.: 17/194,995

(22) Filed: Mar. 8, 2021

(65) Prior Publication Data

US 2022/0077162 A1  Mar. 10, 2022

(30) Foreign Application Priority Data

Sep. 9, 2020 (KR) .................... 10-2020-0115272

(51) Int. Cl.
*H01L 27/11* (2006.01)
*H01L 21/02* (2006.01)
(Continued)

(52) U.S. Cl.
CPC ....... *H10B 10/125* (2023.02); *H01L 21/0259* (2013.01); *H01L 21/28518* (2013.01);
(Continued)

(58) Field of Classification Search
CPC .......... H01L 21/0259; H01L 21/02603; H01L 21/28518; H01L 21/823431; H01L 21/823807; H01L 21/823821; H01L 21/823814; H01L 21/823857; H01L 21/845; H01L 27/0886; H01L 27/0924; H01L 27/1211; H01L 29/0665; H01L 29/0669; H01L 29/0673; H01L 29/0847;
(Continued)

(56) References Cited

U.S. PATENT DOCUMENTS 7,092,307 B2   8/2006  Chen et al.
8,399,935 B2   3/2013  Liaw
(Continued)

FOREIGN PATENT DOCUMENTS

KR  20130115967  10/2013
KR  20150054422   5/2015
KR  20200064241   6/2020

*Primary Examiner* — David C Spalla
(74) *Attorney, Agent, or Firm* — Fish & Richardson P.C.

(57) ABSTRACT

A semiconductor memory device includes a static random access memory (SRAM) cell that is provided on a substrate and includes a pass-gate transistor, a pull-down transistor, and a pull-up transistor. Each of the pass-gate transistor, the pull-down transistor, and the pull-up transistor includes an active fin protruding above a device isolation layer, a gate electrode on the active fin, and a gate insulating layer between the active fin and the gate electrode. The gate insulating layer of the pull-down transistor includes a first dipole element. The highest concentration of the first dipole element of the gate insulating layer of the pull-down transistor is higher than the highest concentration of the first dipole element of the gate insulating layer of the pass-gate transistor.

17 Claims, 26 Drawing Sheets

(51) Int. Cl.
*H01L 21/285* (2006.01)
*H01L 21/8238* (2006.01)
*H01L 27/092* (2006.01)
*H01L 29/06* (2006.01)
*H01L 29/08* (2006.01)
*H01L 29/423* (2006.01)
*H01L 29/45* (2006.01)
*H01L 29/49* (2006.01)
*H01L 29/51* (2006.01)
*H01L 29/66* (2006.01)
*H01L 29/78* (2006.01)
*H01L 29/786* (2006.01)
*H10B 10/00* (2023.01)

(52) U.S. Cl.
CPC ............... *H01L 21/823807* (2013.01); *H01L 21/823814* (2013.01); *H01L 21/823821* (2013.01); *H01L 21/823857* (2013.01); *H01L 21/823871* (2013.01); *H01L 27/0924* (2013.01); *H01L 29/0665* (2013.01); *H01L 29/0847* (2013.01); *H01L 29/42392* (2013.01); *H01L 29/45* (2013.01); *H01L 29/4908* (2013.01); *H01L 29/516* (2013.01); *H01L 29/66545* (2013.01); *H01L 29/66742* (2013.01); *H01L 29/66795* (2013.01); *H01L 29/6684* (2013.01); *H01L 29/78391* (2014.09); *H01L 29/7851* (2013.01); *H01L 29/78618* (2013.01); *H01L 29/78696* (2013.01)

(58) Field of Classification Search
CPC ......... H01L 29/41791; H01L 29/42392; H01L 29/45; H01L 29/4908; H01L 29/516; H01L 29/66439; H01L 29/66545; H01L 29/66742; H01L 29/66795; H01L 29/6684; H01L 29/775; H01L 29/78391; H01L 29/785; H01L 29/7851; H01L 29/7853; H01L 29/7855; H01L 29/78618; H01L 29/78696; H01L 2029/7858; H10B 10/125

See application file for complete search history.

(56) References Cited

U.S. PATENT DOCUMENTS

| | | | |
|---|---|---|---|
| 9,735,061 | B1 | 8/2017 | Kim et al. |
| 10,510,617 | B2 | 12/2019 | Cluschenkov et al. |
| 10,546,787 | B2 | 1/2020 | Bao et al. |
| 10,549,787 | B2* | 2/2020 | Kita ................ B62D 25/2036 |
| 11,201,160 | B2 | 12/2021 | Hong et al. |
| 2013/0272056 | A1 | 10/2013 | Liaw |
| 2015/0129973 | A1 | 5/2015 | Ji et al. |
| 2020/0043850 | A1 | 2/2020 | Yeoh et al. |
| 2020/0194569 | A1 | 6/2020 | Wang et al. |
| 2021/0066137 | A1* | 3/2021 | Hsu ....................... H01L 29/517 |
| 2022/0013523 | A1* | 1/2022 | Cheng ............... H01L 29/78696 |
| 2022/0293767 | A1* | 9/2022 | Pao ..................... H01L 27/0886 |
| 2022/0336291 | A1* | 10/2022 | Chen ............... H01L 21/823857 |

\* cited by examiner

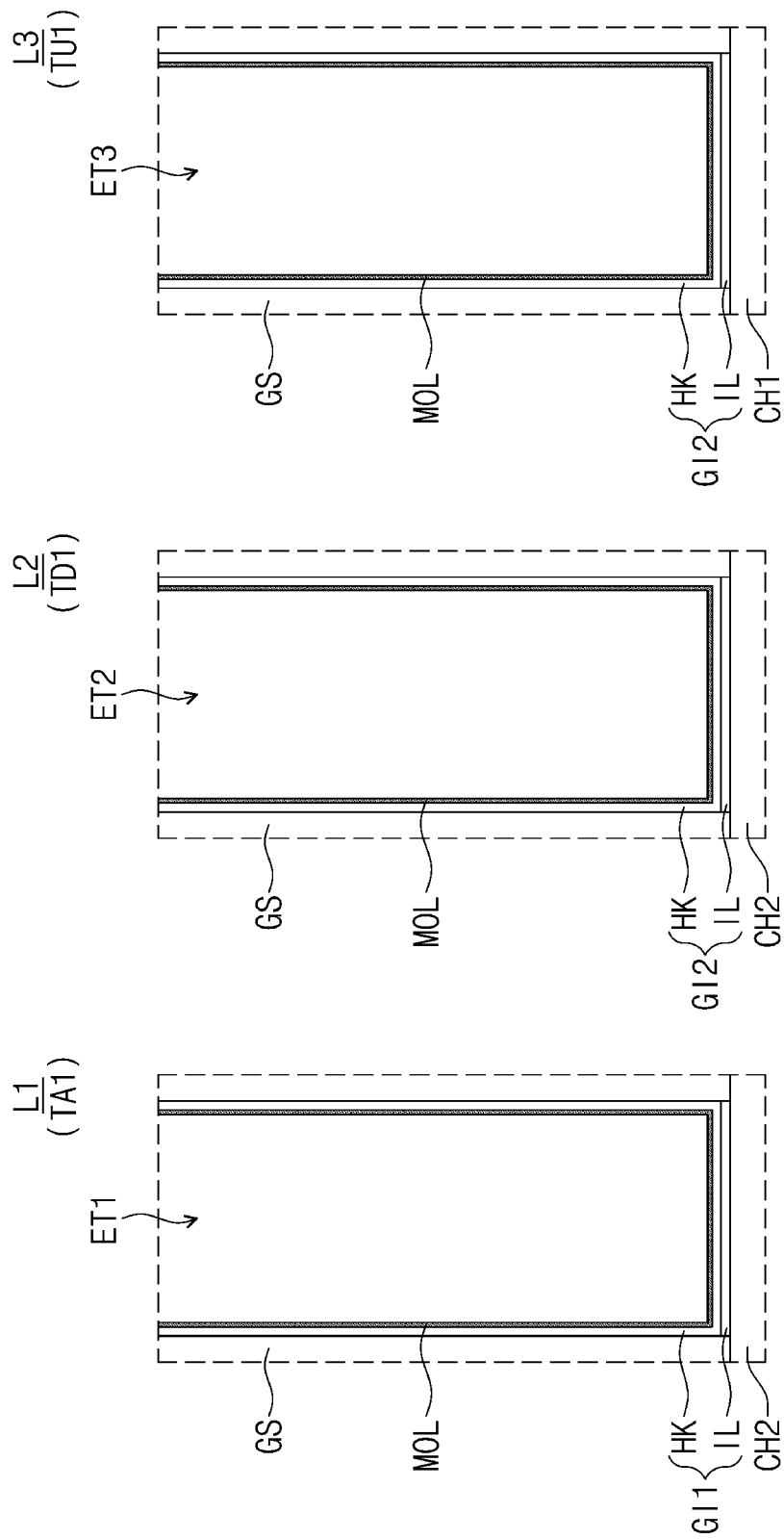

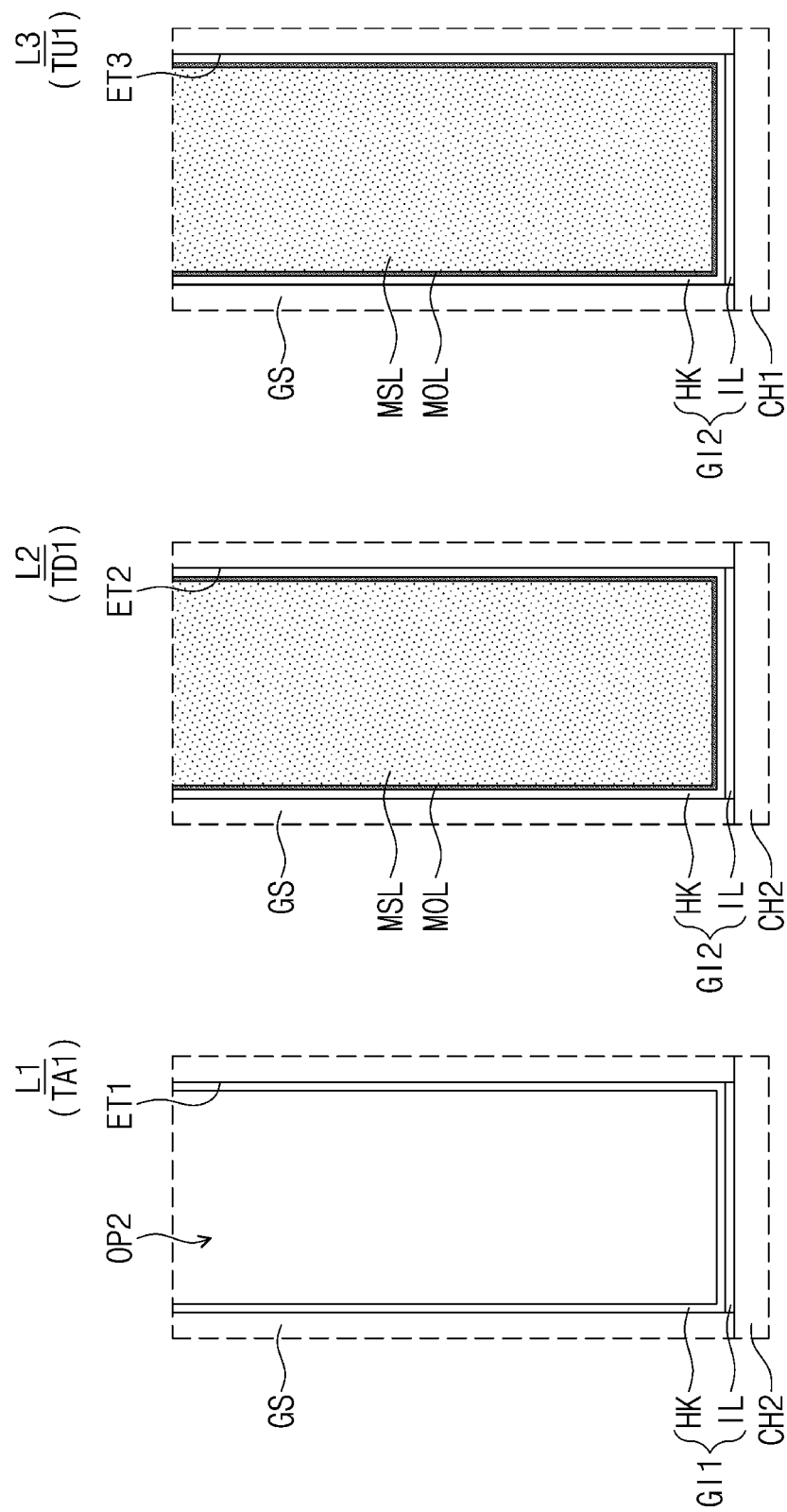

SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2020-0115272, filed on Sep. 9, 2020, in the Korean Intellectual Property Office, the entire contents of which are hereby incorporated by reference.

BACKGROUND OF THE RELATED ART

The present disclosure relates to a semiconductor memory device and a method of fabricating, and in particular, to a semiconductor memory device including a static random access memory (SRAM) cell and a method of fabricating the same.

Due to their small-sized, multifunctional, and/or low-cost characteristics, semiconductor devices are being esteemed as important elements in the electronics industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

An embodiment of the disclosure provides a semiconductor memory device with improved electric characteristics.

An embodiment of the disclosure provides a method of fabricating a semiconductor memory device with improved electric characteristics.

According to an embodiment of the disclosure, a semiconductor memory device may include a static random access memory (SRAM) cell that is provided on a substrate and includes a pass-gate transistor, a pull-down transistor, and a pull-up transistor. Each of the pass-gate transistor, the pull-down transistor, and the pull-up transistor may include an active fin protruding above a device isolation layer, a gate electrode on the active fin, and a gate insulating layer between the active fin and the gate electrode. The gate insulating layer of the pull-down transistor may include a first dipole element. The highest concentration of the first dipole element of the gate insulating layer of the pull-down transistor may be higher than the highest concentration of the first dipole element of the gate insulating layer of the pass-gate transistor.

According to an embodiment of the disclosure, a semiconductor memory device may include an active pattern on a substrate, a first gate electrode and a second gate electrode provided to cross the active pattern and to extend to be parallel to each other in a first direction, a source/drain pattern provided on the active pattern and interposed between the first and second gate electrodes, a first gate insulating layer between the active pattern and the first gate electrode, and a second gate insulating layer between the active pattern and the second gate electrode. The first and second gate electrodes may be adjacent to each other in a second direction crossing the first direction, and the source/drain pattern may have a conductivity of n-type. The second gate insulating layer may include a first dipole element, and the highest concentration of the first dipole element of the second gate insulating layer may be higher than the highest concentration of the first dipole element of the first gate insulating layer.

According to an embodiment of the disclosure, a semiconductor memory device may include a substrate including a bit cell region, a first active pattern and a second active pattern on the bit cell region, the first active pattern being spaced apart from the second active pattern in a first direction, a device isolation layer provided on the substrate to cover a side surface of a lower portion of each of the first and second active patterns, an upper portion of each of the first and second active patterns protruding above the device isolation layer, a first gate electrode extended in the first direction to cross the second active pattern, a second gate electrode extended in the first direction to cross the first and second active patterns, a first source/drain pattern provided on the first active pattern and adjacent to a side of the second gate electrode, a second source/drain pattern provided on the second active pattern and interposed between the first and second gate electrodes, a first gate insulating layer between the first gate electrode and the second active pattern, a second gate insulating layer between the second gate electrode and the second active pattern, a gate spacer on at least one of side surfaces of each of the first and second gate electrodes, a gate capping pattern on each of the first and second gate electrodes, an interlayer insulating layer on the gate capping pattern, an active contact, which is provided to penetrate the interlayer insulating layer, is coupled to the first and second source/drain patterns, and is extended in the first direction to connect the first and second source/drain patterns to each other, a silicide pattern between each of the first and second source/drain patterns and the active contact, and a first interconnection layer, a second interconnection layer, and a third interconnection layer sequentially stacked on the interlayer insulating layer. The second gate insulating layer may include a dipole element, and the highest concentration of the dipole element of the second gate insulating layer may be higher than the highest concentration of the dipole element of the first gate insulating layer.

According to an embodiment of the disclosure, a method of fabricating a semiconductor memory device may include forming an active pattern on a substrate, forming a first sacrificial pattern and a second sacrificial pattern, which are extended in a first direction to cross the active pattern and to be parallel to each other, forming a source/drain pattern, which is interposed between the first and second sacrificial patterns, on the active pattern, selectively removing the first and second sacrificial patterns to form a first empty space and a second empty space exposing the active pattern, forming a first gate insulating layer and a second gate insulating layer in the first and second empty spaces, respectively, forming a metal oxide layer in the second empty space, the metal oxide layer covering the second gate insulating layer and including a dipole element, performing a thermal treatment process to diffuse the dipole element from the metal oxide layer into the second gate insulating layer, and forming a first gate electrode and a second gate electrode in the first and second empty spaces, respectively. The highest concentration of the dipole element of the second gate insulating layer may be higher than the highest concentration of the dipole element of the first gate insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 11, 12, and 13 are sectional views illustrating a process of forming the gates of the first pass-gate transistor, the first pull-down transistor, and the first pull-up transistor, according to an embodiment of the disclosure.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
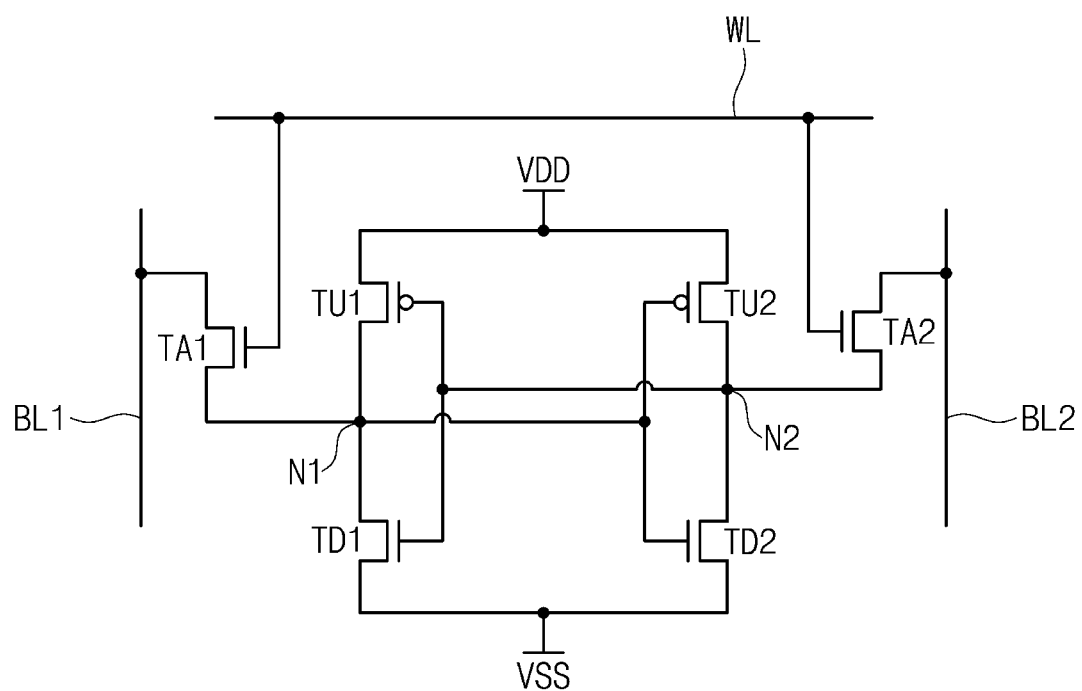
FIG. 1 is an equivalent circuit diagram illustrating an SRAM cell according to an embodiment of the disclosure.

FIG. 1 is an equivalent circuit diagram illustrating a static random access memory (SRAM) cell according to an embodiment of the disclosure.

Referring to FIG. 1, the SRAM cell may include a first pull-up transistor TU1, a first pull-down transistor TD1, a second pull-up transistor TU2, a second pull-down transistor TD2, a first pass-gate transistor TA1, and a second pass-gate transistor TA2. The first and second pull-up transistors TU1 and TU2 may be P-channel metal-oxide semiconductor (PMOS) transistors. The first and second pull-down transistors TD1 and TD2 and the first and second pass-gate transistors TA1 and TA2 may be N-channel metal-oxide semiconductor (NMOS) transistors.

A first source/drain of the first pull-up transistor TU1 and a first source/drain of the first pull-down transistor TD1 may be connected to a first node N1. A second source/drain of the first pull-up transistor TU1 may be connected to a power line VDD, and a second source/drain of the first pull-down transistor TD1 may be connected to a ground line VSS. A gate of the first pull-up transistor TU1 and a gate of the first pull-down transistor TD1 may be electrically connected to each other. The first pull-up transistor TU1 and the first pull-down transistor TD1 may constitute a first inverter. The connected gates of the first pull-up and first pull-down transistors TU1 and TD1 may correspond to an input terminal of the first inverter, and the first node N1 may correspond to an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line VDD, and a second source/drain of the second pull-down transistor TD2 may be connected to the ground line VSS. A gate of the second pull-up transistor TU2 and a gate of the second pull-down transistor TD2 may be electrically connected to each other. Thus, the second pull-up transistor TU2 and the second pull-down transistor TD2 may constitute a second inverter. The connected gates of the second pull-up and second pull-down transistors TU2 and TD2 may correspond to an input terminal of the second inverter, and the second node N2 may correspond to an output terminal of the second inverter.

The first and second inverters may be combined to form a latch structure. For example, the gates of the first pull-up and first pull-down transistors TU1 and TD1 may be electrically connected to the second node N2, and the gates of the second pull-up and second pull-down transistors TU2 and TD2 may be electrically connected to the first node N1. A first source/drain of the first pass-gate transistor TA1 may be connected to the first node N1, and a second source/drain of the first pass-gate transistor TA1 may be connected to a first bit line BL1. A first source/drain of the second pass-gate transistor TA2 may be connected to the second node N2, and a second source/drain of the second pass-gate transistor TA2 may be connected to a second bit line BL2. Gates of the first and second pass-gate transistors TA1 and TA2 may be electrically coupled to a word line WL. Thus, the SRAM cell according to an embodiment of the disclosure may be realized.

Figure 2:
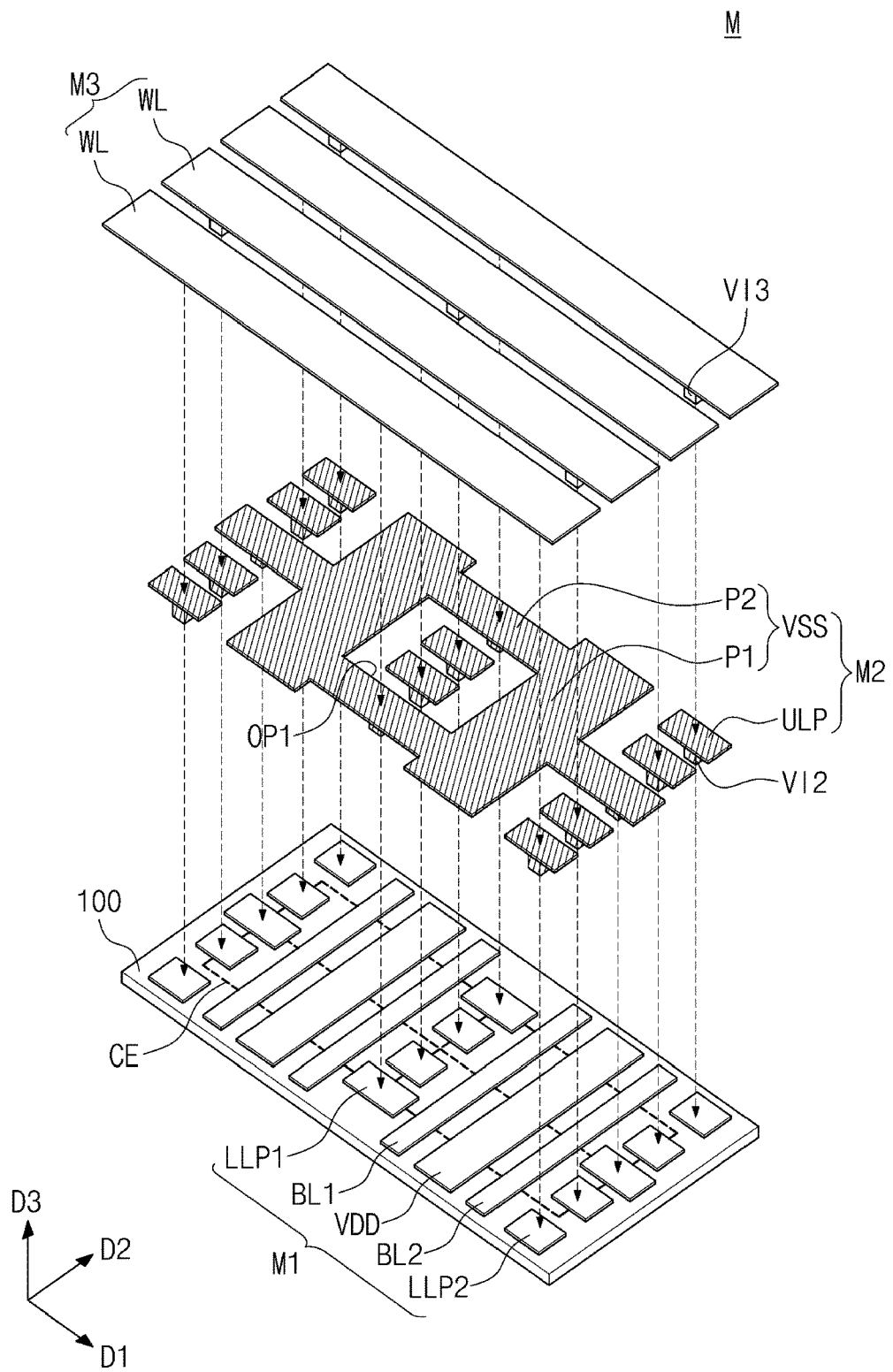
FIG. 2 is a perspective view illustrating interconnection layers of a semiconductor memory device according to an embodiment of the disclosure.
Figure 3:
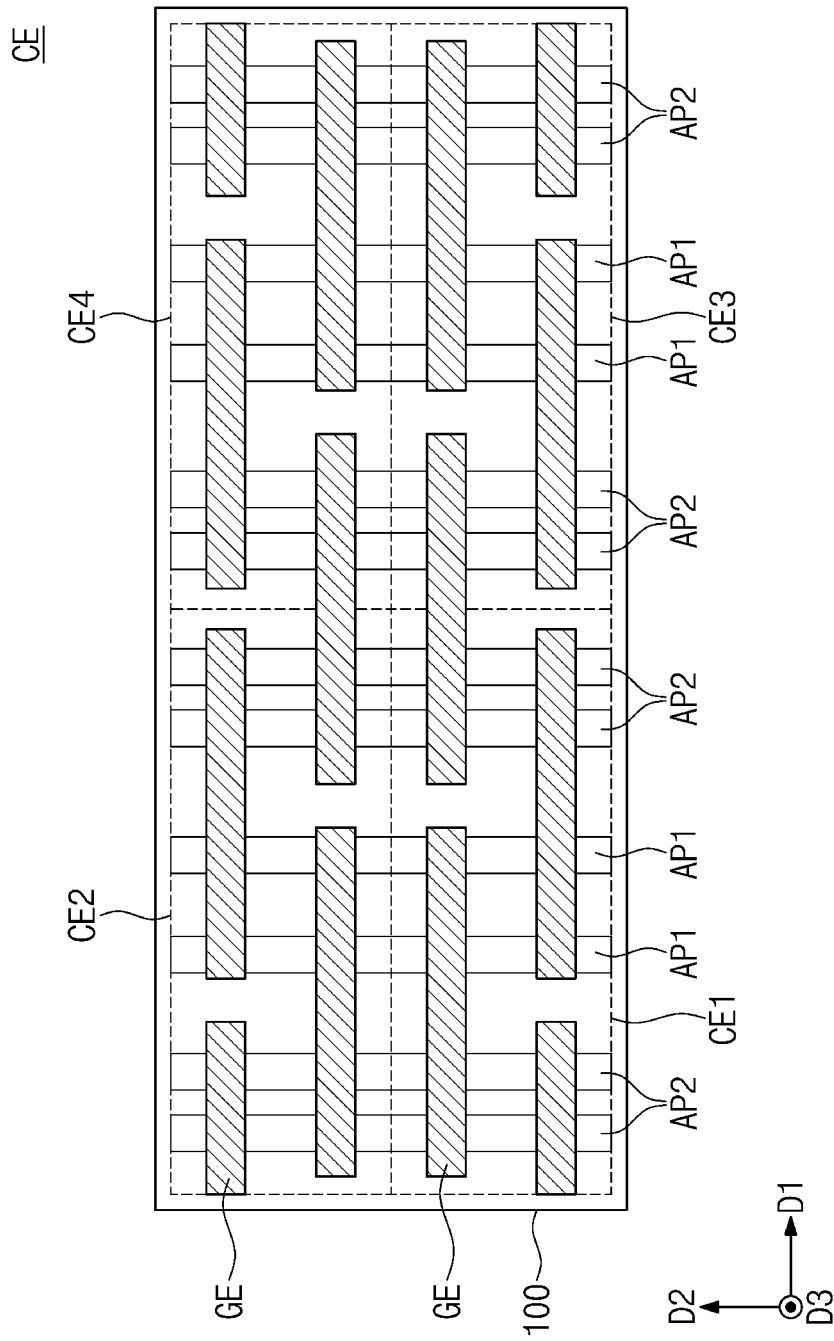
FIG. 3 is a plan view illustrating a memory cell of FIG. 2.

FIG. 2 is a perspective view illustrating interconnection layers of a semiconductor memory device M according to an embodiment of the disclosure. FIG. 3 is a plan view illustrating a memory cell of FIG. 2.

Referring to FIGS. 2 and 3, a memory cell CE may be provided on a substrate 100. Referring to FIG. 3, the memory cell CE may include first to fourth bit cells CE1-CE4, which are arranged in a 2×2 array. Each of the first to fourth bit cells CE1-CE4 may be the SRAM cell previously described with reference to FIG. 1. As a representative example of the first to fourth bit cells CE1-CE4, a structure of the first bit cell CE1 will be described in more detail with reference to FIGS. 4 and 5A to 5D. Each of the second to fourth bit cells CE2, CE3, and CE4 may be provided to have a structure symmetric to the first bit cell CE1.

A first interconnection layer M1, a second interconnection layer M2, and a third interconnection layer M3 may be provided on the memory cell CE. The first to third interconnection layers M1, M2, and M3 may be sequentially stacked. The first to third interconnection layers M1, M2, and M3 may be formed of or include at least one of conductive metal nitrides (e.g., titanium nitride or tantalum nitride) or metallic materials (e.g., titanium, tantalum, tungsten, copper, or aluminum).

The first interconnection layer M1 may include the first bit line BL1, the second bit line BL2, and the power line VDD, which are provided to extend in a second direction D2. The power line VDD may be interposed between the first bit line BL1 and the second bit line BL2. When viewed in a plan view, the first bit line BL1, the second bit line BL2, and the power line VDD may have line-shaped patterns. A width of the power line VDD may be larger than a width of each of the first and second bit lines BL1 and BL2, when measured in a first direction D1.

The first interconnection layer M1 may further include a first lower landing pad LLP1 and a second lower landing pad LLP2, which are provided near the first and second bit lines BL1 and BL2. The first and second lower landing pads LLP1 and LLP2 may be arranged in the second direction D2. When viewed in a plan view, each of the first and second lower landing pads LLP1 and LLP2 may be an island-shape pattern.

The first interconnection layer M1 may further include first vias, which are respectively provided below the first bit line BL1, the second bit line BL2, the power line VDD, the first lower landing pad LLP1, and the second lower landing pad LLP2. The memory cell CE and the first interconnection layer M1 may be electrically connected to each other through the first vias.

The second interconnection layer M2 may include the ground line VSS and an upper landing pad ULP. The ground line VSS may be a mesh-shaped conductive structure. The ground line VSS may have at least one first opening OP1. In detail, the ground line VSS may include a first portion P1 extending in the second direction D2 and a second portion P2 extending in the first direction D1. A width of the first portion P1 may be larger than a width of the second portion P2. The first opening OP1 may be defined by an adjacent pair of the first portions P1 and an adjacent pair of the second portions P2.

An adjacent pair of the upper landing pads ULP may be disposed in the first opening OP1. The adjacent pair of the upper landing pads ULP in the first opening OP1 may be arranged in the second direction D2. When viewed in a plan view, the upper landing pads ULP may be island-shaped patterns.

The second portions P2 of the ground line VSS may be respectively overlapped with the first lower landing pads LLP1, when viewed in a plan view. The upper landing pads ULP may be respectively overlapped with the second lower landing pads LLP2, when viewed in a plan view.

The second interconnection layer M2 may further include second vias VI2, which are respectively provided below the ground line VSS and the upper landing pad ULP. The ground line VSS may be electrically connected to the first lower landing pad LLP1 of the first interconnection layer M1 through the second via VI2. Since a plurality of the second vias VI2 are provided below the ground line VSS, a plurality of the first lower landing pads LLP1 may be connected in common to a single ground line VSS. The upper landing pad ULP may be electrically connected to the second lower landing pad LLP2 of the first interconnection layer M1 through the second via VI2.

In an embodiment, the second interconnection layer M2 may be composed of only the ground line VSS, the upper landing pads ULP, and the second vias VI2. In other words, the second interconnection layer M2 may not include any other line (e.g., a bit line, a power line, and a word line), except for the ground line VSS.

The third interconnection layer M3 may include the word lines WL extending in the first direction D1. The word lines WL may be arranged in the second direction D2. When viewed in a plan view, the word lines WL may be line-shaped patterns.

The third interconnection layer M3 may further include a third via VI3 provided below the word line WL. The word line WL may be electrically connected to the upper landing pad ULP of the second interconnection layer M2 through the third via VI3. In other words, the word line WL may be electrically connected to the second lower landing pad LLP2 of the first interconnection layer M1 through the third via VI3, the upper landing pad ULP, and the second via VI2.

In an embodiment, the third interconnection layer M3 may be composed of only the word lines WL and the third vias VI3. In other words, the third interconnection layer M3 may not include any other line (e.g., the bit line, the power line, and the ground line), except for the word line WL.

Figure 4:
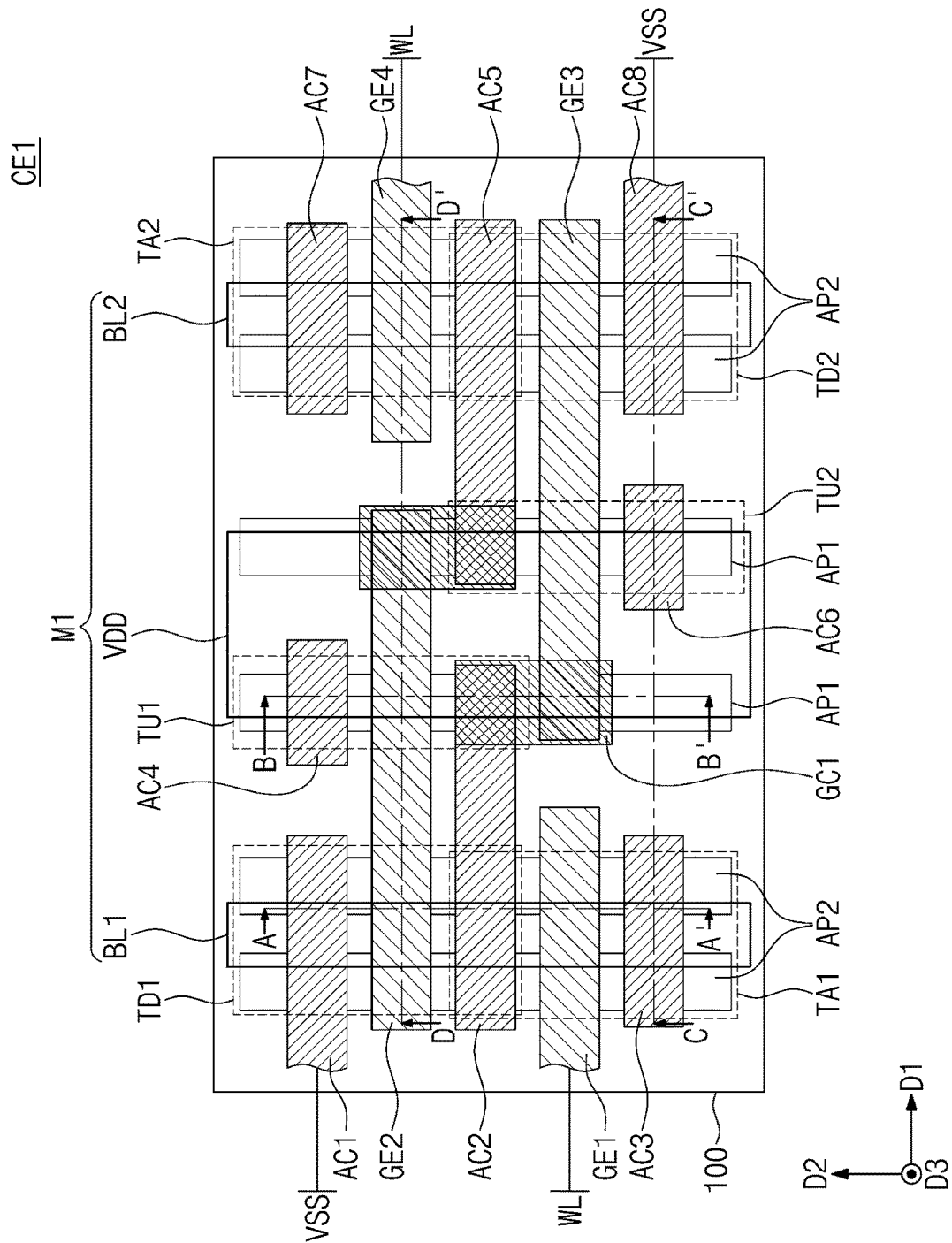
FIG. 4 is a plan view illustrating a first bit cell of FIG. 3, which is an SRAM cell according to the circuit diagram of FIG. 1.

FIG. 4 is a plan view illustrating a first bit cell of FIG. 3, which is an SRAM cell according to the circuit diagram of FIG. 1. FIGS. 5A to 5D are sectional views taken along lines A-A', B-B', C-C', and D-D', respectively, of FIG. 4.

Referring to FIGS. 1, 4, and 5A to 5D, the first bit cell CE1 on the substrate 100 may include an SRAM cell. A device isolation layer ST may be provided on the substrate 100. The device isolation layer ST may define first and second active patterns AP1 and AP2. The substrate 100 may be a semiconductor substrate that is formed of or includes silicon, germanium, silicon-germanium, or a compound semiconductor material. The device isolation layer ST may be formed of or include at least one of insulating materials (e.g., silicon oxide).

The first and second active patterns AP1 and AP2 may be portions of the substrate 100. A trench TR may be defined between adjacent ones of the first and second active patterns AP1 and AP2. The device isolation layer ST may fill the trench TR. Upper portions of the first and second active patterns AP1 and AP2 may be vertically extended to have a shape protruding above the device isolation layer ST. Each of the upper portions of the first and second active patterns AP1 and AP2 may be a fin-shape structure vertically protruding above the device isolation layer ST. For example, each of the first and second active patterns AP1 and AP2 may be an active fin.

In the present embodiment, the first bit cell CE1 may include a pair of the first active patterns AP1 and two pairs of the second active patterns AP2. One pair of the two pairs of the second active patterns AP2 may constitute a body of the first pass-gate transistor TA1 and a body of the first pull-down transistor TD1. The other pair of the two pairs of the second active patterns AP2 may constitute a body of the second pass-gate transistor TA2 and a body of the second pull-down transistor TD2. One of the pair of the first active patterns AP1 may constitute a body of the first pull-up transistor TU1. The other of the pair of the first active patterns AP1 may constitute a body of the second pull-up transistor TU2. A distance of an adjacent pair of the first active patterns AP1 may be larger than a distance of an adjacent pair of the second active patterns AP2.

In another embodiment, two second active patterns AP2 may be provided, instead of the two pairs of the second active patterns AP2. In other words, one pair of the second active patterns AP2 may be provided as a single second active pattern AP2.

First channel patterns CH1 and first source/drain patterns SD1 may be provided in the upper portions of the first active patterns AP1. Second channel patterns CH2 and second source/drain patterns SD2 may be provided in the upper portions of the second active patterns AP2. The first source/drain patterns SD1 may be p-type impurity regions. The second source/drain patterns SD2 may be n-type impurity regions. Each of the first channel patterns CH1 may be interposed between a pair of the first source/drain patterns SD1, and each of the second channel patterns CH2 may be interposed between a pair of the second source/drain patterns SD2.

The first and second source/drain patterns SD1 and SD2 may be epitaxial patterns formed by a selective epitaxial growth process. The first and second source/drain patterns SD1 and SD2 may have top surfaces that are located at a level higher than top surfaces of the first and second channel patterns CH1 and CH2. The first and second source/drain patterns SD1 and SD2 may be formed of or include a semiconductor material that is the same as or different from that of the substrate 100. As an example, the first source/drain patterns SD1 may be formed of or include a semiconductor material whose lattice constant is greater than that of the substrate 100. Thus, the first source/drain patterns SD1 may exert a compressive stress on the first channel patterns CH1. As an example, the second source/drain patterns SD2 may be formed of or include the same semiconductor material as the substrate 100.

The second source/drain patterns SD2 on an adjacent pair of the second active patterns AP2 may be merged to form a single second source/drain electrode. This may be because a distance between the pair of the second active patterns AP2 is relatively small.

First to fourth gate electrodes GE1-GE4 may be provided to cross the first and second active patterns AP1 and AP2 and to extend in the first direction D1. The first to fourth gate electrodes GE1-GE4 may be overlapped with the first and second channel patterns CH1 and CH2, when viewed in a plan view. The first gate electrode GE1 may be symmetric to the fourth gate electrode GE4, and the second gate electrode GE2 may be symmetric to the third gate electrode GE3.

The second gate electrode GE2 and the fourth gate electrode GE4 may be aligned to be parallel to the first direction D1 and to be parallel to each other. An insulating pattern SP may be interposed between the second gate electrode GE2 and the fourth gate electrode GE4 to separate them from each other. The first gate electrode GE1 and the third gate electrode GE3 may be aligned to be parallel to the first direction D1 and to be parallel to each other. The insulating pattern SP may be interposed between the first gate electrode GE1 and the third gate electrode GE3 to separate them from each other.

A pair of gate spacers GS may be disposed on opposite side surfaces of each of the first to fourth gate electrodes GE1-GE4. The gate spacers GS may be extended along gate electrodes GE and in the first direction D1. Top surfaces of the gate spacers GS may be higher than top surfaces of the first to fourth gate electrodes GE1-GE4. The top surfaces of the gate spacers GS may be coplanar with a top surface of a first interlayer insulating layer 110, which will be described below. The gate spacers GS may be formed of or include at least one of SiO, SiCN, SiCON, or SiN. Alternatively, the gate spacers GS may be a multi-layered structure including at least two of SiO, SiCN, SiCON, or SiN.

A gate insulating layer GI may be interposed between the first to fourth gate electrodes GE1-GE4 and the first and second active patterns AP1 and AP2. The gate insulating layer GI may be extended along a bottom surface of the gate electrode GE1-GE4.

Referring back to FIG. 5D, the second gate electrode GE2 may be provided on a first top surface TS1 of the first channel pattern CH1 and at least one first side surface SW1 of the first channel pattern CH1. The fourth gate electrode GE4 may be provided on a second top surface TS2 of the second channel pattern CH2 and at least one second side surface SW2 of the second channel pattern CH2. In other words, the transistor according to the present embodiment may be a three-dimensional field-effect transistor (e.g., FinFET), in which the gate electrode is provided to three-dimensionally surround the channel patterns.

Gate capping patterns GP may be provided on the first to fourth gate electrodes GE1-GE4, respectively. The gate capping pattern GP may be extended along the gate electrode GE1-GE4 and in the first direction D1. The gate capping pattern GP may be interposed between the pair of the gate spacers GS. The gate capping pattern GP may be formed of or include at least one of materials that are chosen to have an etch selectivity with respect to first to fourth interlayer insulating layers 110, 120, 130, and 140, which will be described below. For example, the gate capping patterns GP may be formed of or include at least one of SiON, SiCN, SiCON, or SiN.

The first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and the top surfaces of the gate spacers GS.

First to eighth active contacts AC1-AC8 may be provided. The first to eighth active contacts AC1-AC8 may be provided to penetrate the first interlayer insulating layer 110 and may be coupled to the first and second source/drain patterns SD1 and SD2. The first to eighth active contacts AC1-AC8 may have top surfaces that are coplanar with the top surface of the first interlayer insulating layer 110.

Each of the first to eighth active contacts AC1-AC8 may be a self-aligned contact plug. In other words, the active contact AC1-AC8 may be formed in a self-aligned manner by the gate capping pattern GP and the gate spacer GS. For example, the active contact AC1-AC8 may cover at least a portion of a side surface of the gate spacer GS.

Silicide patterns SC may be respectively interposed between the first to eighth active contacts AC1-AC8 and the first and second source/drain patterns SD1 and SD2. Each of the active contacts AC1-AC8 may be electrically connected to the source/drain pattern SD1 or SD2 through the silicide pattern SC. The silicide pattern SC may be formed of or include at least one of metal-silicide materials (e.g., titanium silicide, tantalum silicide, tungsten silicide, nickel silicide, and cobalt silicide).

A first gate contact GC1 may be provided on the third gate electrode GE3, and a second gate contact GC2 may be provided on the second gate electrode GE2. The first gate contact GC1 may be provided to penetrate the first interlayer insulating layer 110, the gate spacers GS, and the gate capping pattern GP and may be coupled to the third gate electrode GE3. The second gate contact GC2 may be provided to penetrate the first interlayer insulating layer 110, the gate spacers GS, and the gate capping pattern GP and may be coupled to the second gate electrode GE2.

Top surfaces of the first and second gate contacts GC1 and GC2 may be coplanar with the top surface of the first interlayer insulating layer 110. A bottom surface of each of the first and second gate contacts GC1 and GC2 may be located at a level lower than bottom surfaces of the first to eighth active contacts AC1-AC8.

Figure 5A:
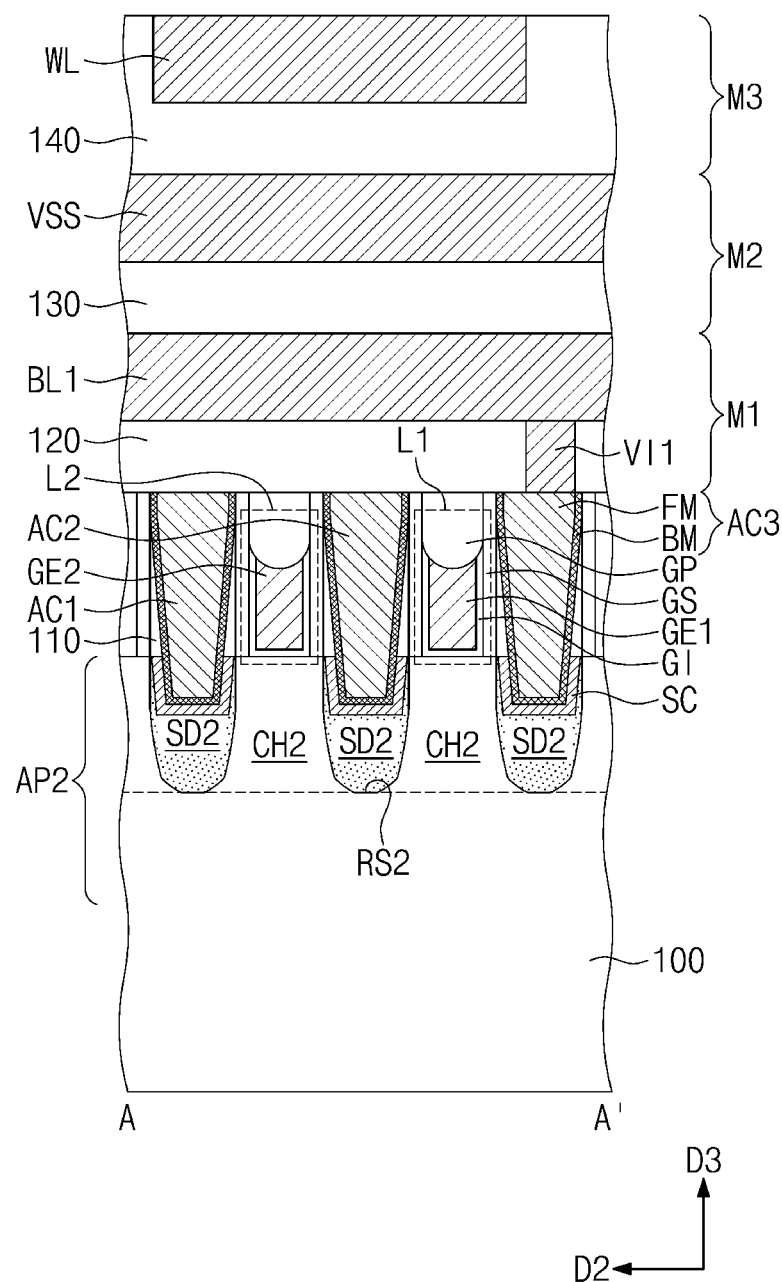
FIGS. 5A to 5D are sectional views taken along lines A-A', B-B', C-C', and D-D', respectively, of FIG. 4.
Figure 5B:
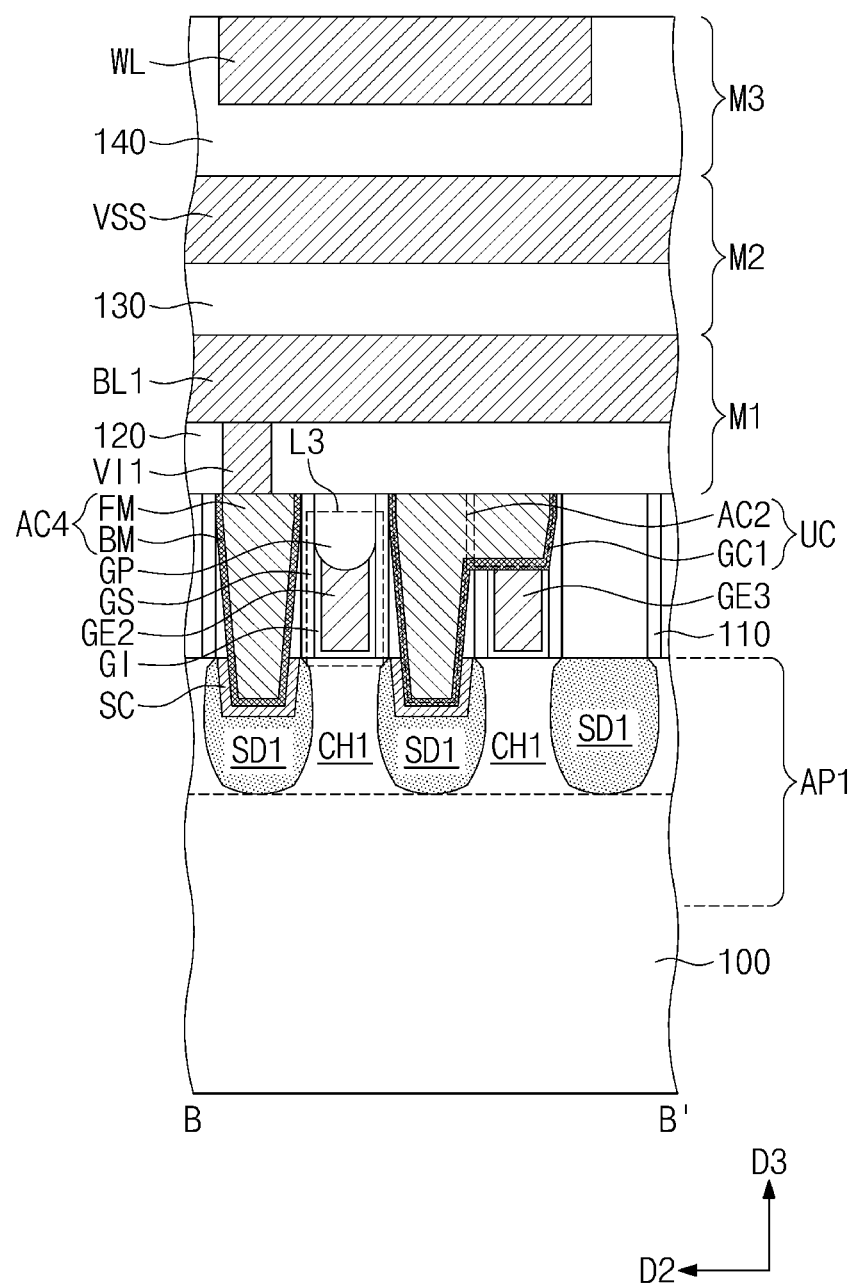
Figure 5C:
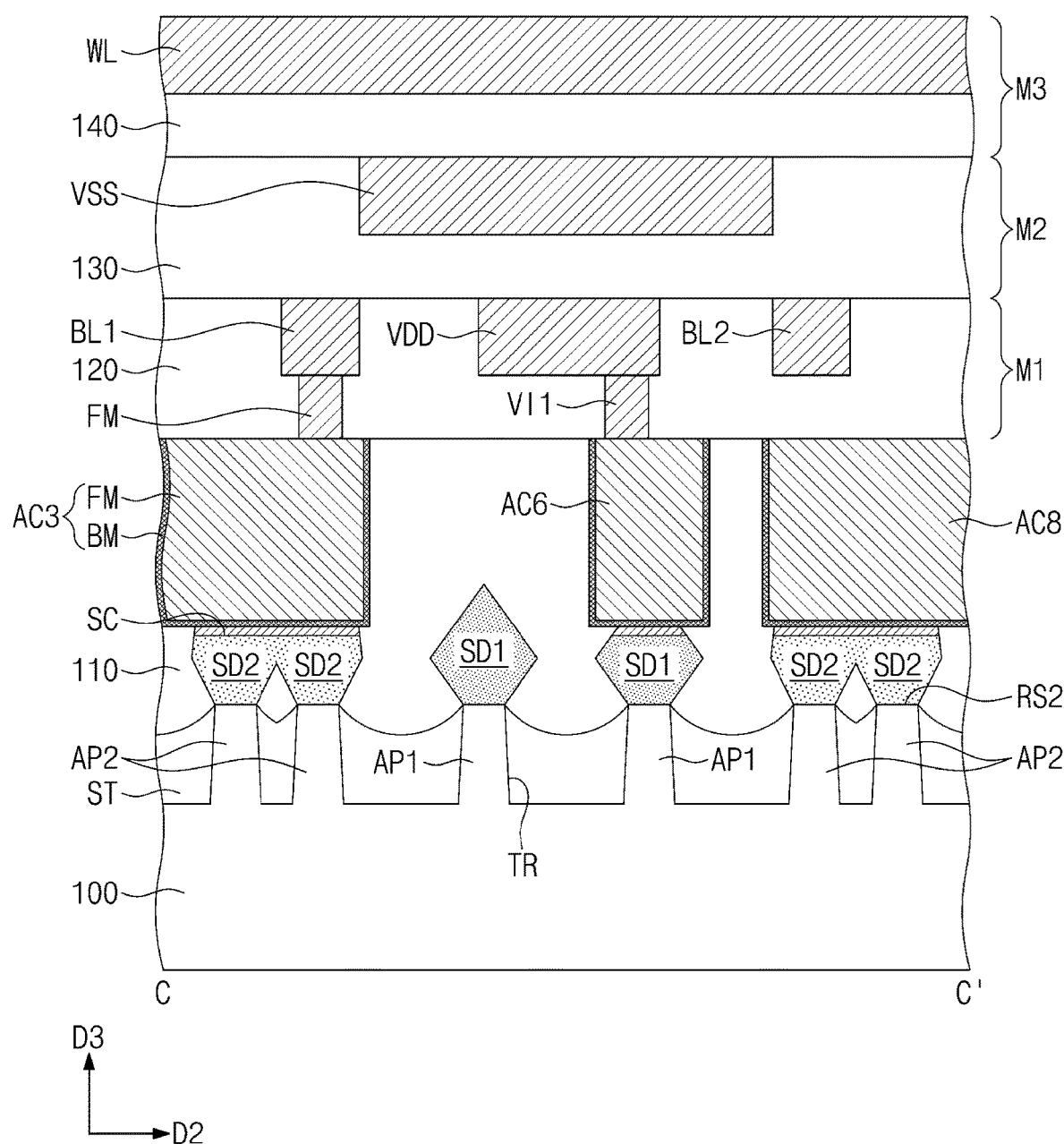
Figure 5D:
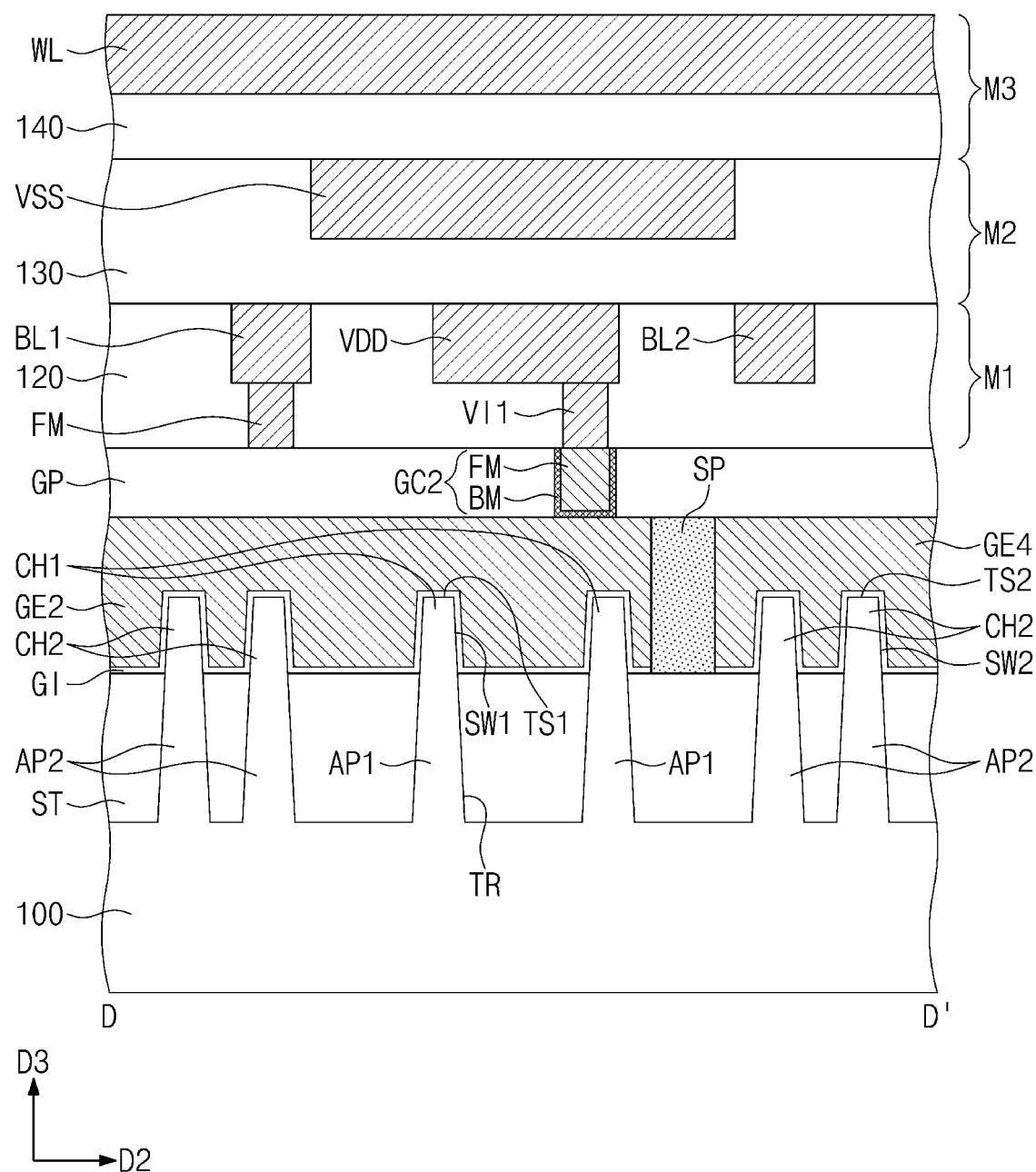

Referring to FIG. 5B, the first gate contact GC1 may be connected to the second active contact AC2 to constitute a single object (e.g., a contact structure UC). The third gate electrode GE3 may be directly connected to the first source/drain pattern SD1, which is adjacent to the third gate electrode GE3, through the contact structure UC. The second gate contact GC2 may also be connected to the fifth active contact AC5 to constitute a single object (i.e., another contact structure).

Each of the active contacts AC1-AC8 and the gate contacts GC1 and GC2 may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may cover side and bottom surfaces of the conductive pattern FM. The barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A second interlayer insulating layer 120, a third interlayer insulating layer 130, and a fourth interlayer insulating layer 140 may be sequentially provided on the first interlayer insulating layer 110. As an example, the first to fourth interlayer insulating layers 110, 120, 130, and 140 may be formed of or include silicon oxide.

The first interconnection layer M1 may be provided in the second interlayer insulating layer 120. The first interconnection layer M1 may include the first bit line BL1, the second bit line BL2, the power line VDD, the first lower landing pad LLP1, the second lower landing pad LLP2, and first vias VI1, as previously described with reference to FIG. 2.

The second interconnection layer M2 may be provided in the third interlayer insulating layer 130. The second interconnection layer M2 may include the ground line VSS, the upper landing pad ULP, and the second vias VI2, as previously described with reference to FIG. 2.

The third interconnection layer M3 may be provided in the fourth interlayer insulating layer 140. The third interconnection layer M3 may include the word lines WL and the third vias VI3, as previously described with reference to FIG. 2.

The first and second active patterns AP1 and AP2 and the first to fourth gate electrodes GE1-GE4 may constitute memory transistors. The memory transistors of the first bit cell CE1 may include the first pull-up transistor TU1, the first pull-down transistor TD1, the second pull-up transistor TU2, the second pull-down transistor TD2, the first pass-gate transistor TA1, and the second pass-gate transistor TA2 previously described with reference to FIG. 1.

The first gate electrode GE1 may serve as the gate of the first pass-gate transistor TA1. The first gate electrode GE1 may be electrically connected to the word line WL. The second gate electrode GE2 may serve as a common gate of the first pull-down and first pull-up transistors TD1 and TU1. The third gate electrode GE3 may serve as a common gate of the second pull-down and second pull-up transistors TD2 and TU2. The fourth gate electrode GE4 may serve as the gate of the second pass-gate transistor TA2. The fourth gate electrode GE4 may be electrically connected to the word line WL.

The first active contact AC1 may be electrically connected to the second source/drain of the first pull-down transistor TD1. The first active contact AC1 may be electrically connected to the ground line VSS.

The second active contact AC2 may be electrically connected to a common source/drain (e.g., the first source/drain) of the first pull-down transistor TD1 and the first pass-gate transistor TA1. The second active contact AC2 may be extended in the first direction D1 and may be electrically connected to the first source/drain of the first pull-up transistor TU1. The second active contact AC2 may correspond to the first node N1 of FIG. 1.

The third active contact AC3 may be electrically connected to the second source/drain of the first pass-gate transistor TA1. The third active contact AC3 may be electrically connected to the first bit line BL1 through the first via VIE The fourth active contact AC4 may be electrically connected to the second source/drain of the first pull-up transistor TUE The fourth active contact AC4 may be electrically connected to the power line VDD through the first via VIE The fifth active contact AC5 may be electrically connected to the first source/drain of the second pull-up transistor TU2. The fifth active contact AC5 may be extended in the first direction D1 and may be electrically connected to a common source/drain (e.g., the first source/drain) of the second pull-down transistor TD2 and the second pass-gate transistor TA2. The fifth active contact AC5 may correspond to the second node N2 of FIG. 1.

The sixth active contact AC6 may be electrically connected to the second source/drain of the second pull-up transistor TU2. The sixth active contact AC6 may be electrically connected to the power line VDD through the first via VIE The seventh active contact AC7 may be electrically connected to the second source/drain of the second pass-gate transistor TA2. The seventh active contact AC7 may be electrically connected to the second bit line BL2 through the first via VIE The eighth active contact AC8 may be electrically connected to the second source/drain of the second pull-down transistor TD2. The eighth active contact AC8 may be electrically connected to the ground line VSS.

The first gate contact GC1 may connect the second active contact AC2 electrically to the third gate electrode GE3. In other words, the first gate contact GC1 may be provided to electrically connect the first node N1 of FIG. 1 to the common gate of the second pull-up and second pull-down transistors TU2 and TD2.

The second gate contact GC2 may connect the fifth active contact AC5 electrically to the second gate electrode GE2. In other words, the second gate contact GC2 may be provided to electrically connect the second node N2 of FIG. 1 to the common gate of the first pull-up and first pull-down transistors TU1 and TD1.

Figure 6A:
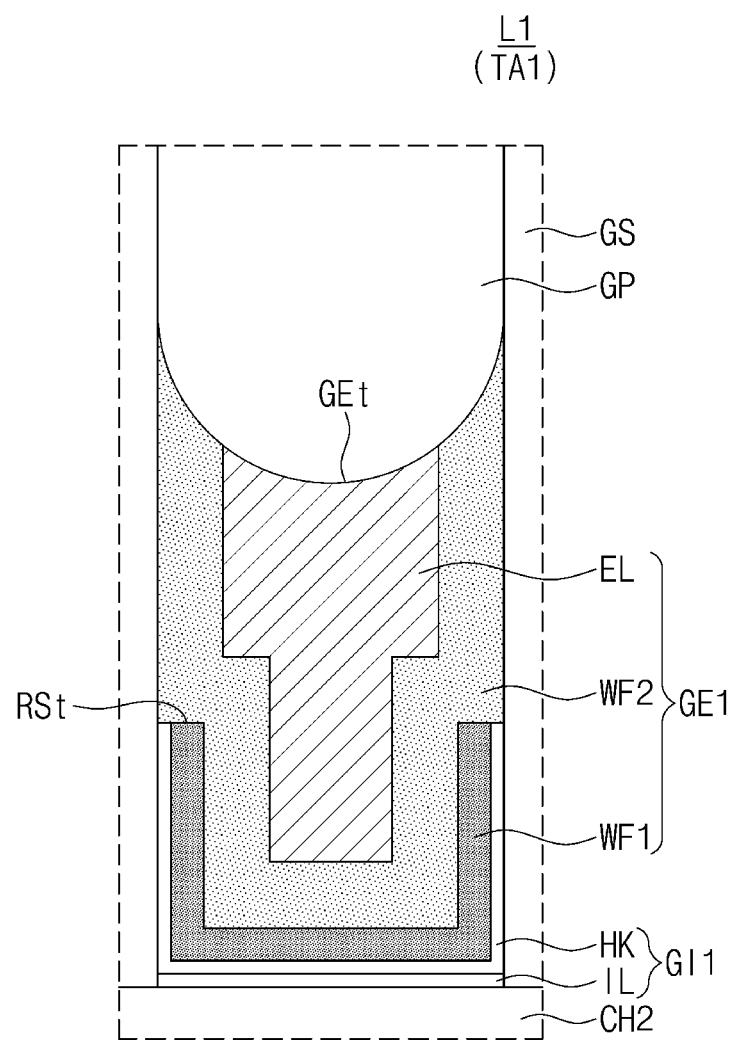
FIG. 6A is an enlarged sectional view of a portion L1 of FIG. 5A, which is provided to illustrate a gate of a first pass-gate transistor.
Figure 6B:
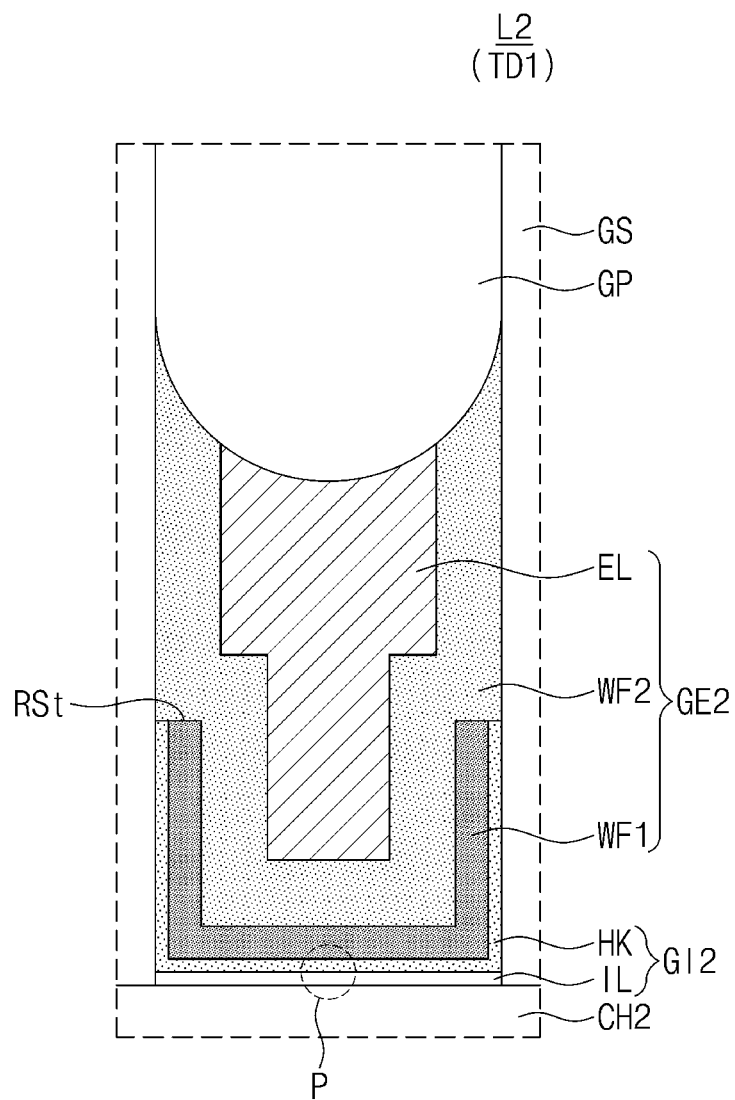
FIG. 6B is an enlarged sectional view of a portion L2 of FIG. 5A, which is provided to illustrate a gate of a first pull-down transistor.
Figure 6C:
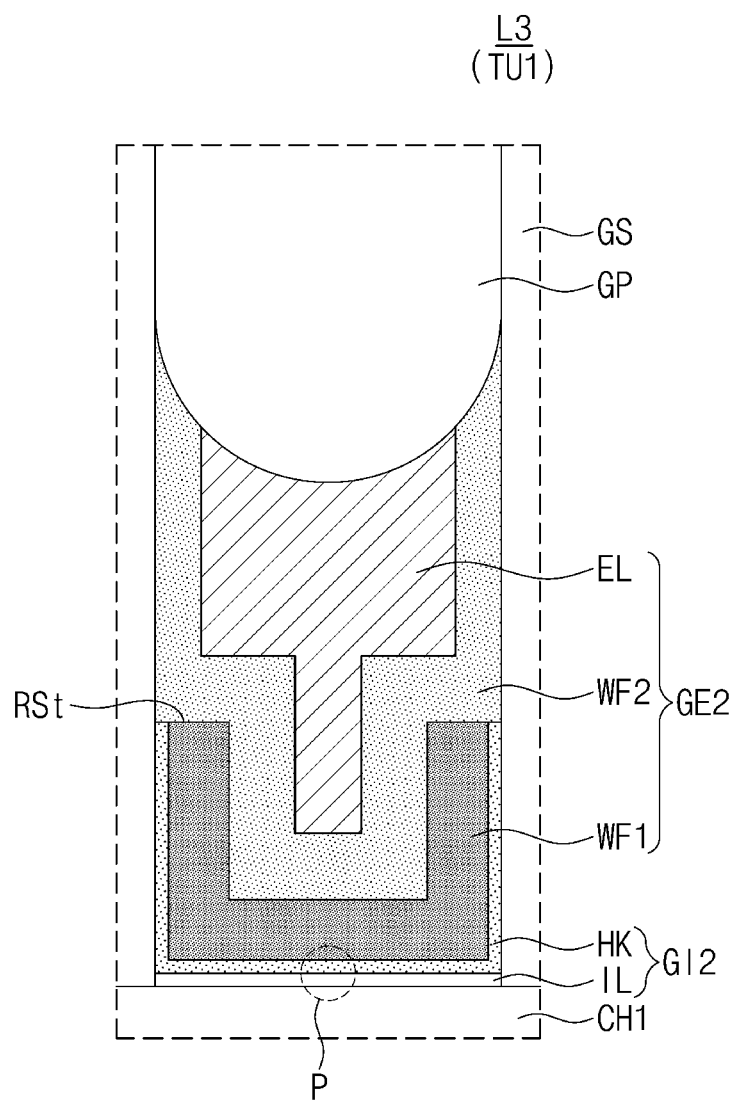
FIG. 6C is an enlarged sectional view of a portion L3 of FIG. 5B, which is provided to illustrate a gate of a first pull-up transistor.

FIG. 6A is an enlarged sectional view of a portion L1 of FIG. 5A, which is provided to illustrate a gate of a first pass-gate transistor. FIG. 6B is an enlarged sectional view of a portion L2 of FIG. 5A, which is provided to illustrate a gate of a first pull-down transistor. FIG. 6C is an enlarged sectional view of a portion L3 of FIG. 5B, which is provided to illustrate a gate of a first pull-up transistor.

Referring to FIG. 6A, the first gate electrode GE1 on the second channel pattern CH2 may be the gate of the first pass-gate transistor TA1 that is an NMOS transistor. A first gate insulating layer GI1 may be interposed between the first gate electrode GE1 and the second channel pattern CH2. The first gate insulating layer GI1 may include an interface layer IL, which is provided to directly cover a surface of the second channel pattern CH2, and a high-k dielectric layer HK, which is provided on the interface layer IL. In an embodiment, the high-k dielectric layer HK may be thicker than the interface layer IL. The interface layer IL may include a silicon oxide layer or a silicon oxynitride layer.

The high-k dielectric layer HK may be formed of or include a high-k dielectric material whose dielectric constant is higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The first gate electrode GE1 may include a first metal pattern WF1, a second metal pattern WF2, and an electrode pattern EL. The first metal pattern WF1 may be provided on the gate insulating layer GI. For example, the gate insulating layer GI may be interposed between the first metal pattern WF1 and the second channel pattern CH2.

The gate insulating layer GI and the first metal pattern WF1 may be chamfered such that upper portions of them are lower than the top surface of the gate electrode GE. As an example, the first metal pattern WF1 may have a recessed top surface RSt that is lower than the lowermost portion GEt of the top surface of the gate electrode GE.

The first metal pattern WF1 may be formed of or include a metal nitride whose work function is relatively high. For example, the first metal pattern WF1 may be formed of or include at least one of p-type work function metals. As an example, the first metal pattern WF1 may be formed of or include at least one of titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

The second metal pattern WF2 may be provided on the first metal pattern WF1. The second metal pattern WF2 may cover the recessed top surface RSt of the first metal pattern WF1. The second metal pattern WF2 may be formed of or include a metal carbide whose work function is relatively low. In other words, the second metal pattern WF2 may be formed of or include an n-type work function metal. The second metal pattern WF2 may be formed of or include at least one of metal carbides that are doped with silicon and/or aluminum and contain silicon and/or aluminum. As an example, the second metal pattern WF2 may be formed of or include aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC). As another example, the second metal pattern WF2 may be formed of or include titanium carbide (TiAlSiC), which is doped with aluminum and silicon, or tantalum carbide (TaAlSiC), which is doped with aluminum and silicon. As another example, the second metal pattern WF2 may be formed of or include aluminum-doped titanium (TiAl).

By adjusting a doping concentration of silicon or aluminum used as the dopant of the second metal pattern WF2, it may be possible to control a work function of the second metal pattern WF2. In an embodiment, a concentration of an impurity (e.g., silicon or aluminum) in the second metal pattern WF2 may range from 0.1 at % to 25 at %.

The electrode pattern EL may be provided on the second metal pattern WF2. Resistance of the electrode pattern EL may be lower than that of the first and second metal patterns WF1 and WF2. As an example, the electrode pattern EL may be formed of or include at least one of low resistance metallic materials (e.g., including aluminum (Al), tungsten (W), titanium (Ti), and tantalum (Ta)).

In an embodiment, the first and second metal patterns WF1 and WF2 may be adjacent to the second channel pattern CH2. The first and second metal patterns WF1 and WF2 may serve as a work function metal of adjusting a threshold voltage of the first pass-gate transistor TA1. In other words, by adjusting a thickness and composition of each of the first and second metal patterns WF1 and WF2, it may be possible to realize a transistor having a desired threshold voltage.

Referring to FIG. 6B, the second gate electrode GE2 on the second channel pattern CH2 may be the gate of the first pull-down transistor TD1 that is an NMOS transistor. A second gate insulating layer GI2 may be interposed between the second gate electrode GE2 and the second channel pattern CH2. The second gate insulating layer GI2 may include the interface layer IL, which is provided to directly cover a surface of the second channel pattern CH2, and the high-k dielectric layer HK, which is provided on the interface layer IL.

The second gate electrode GE2 may include the first metal pattern WF1, the second metal pattern WF2, and the electrode pattern EL. The first metal pattern WF1, the second metal pattern WF2, and the electrode pattern EL of the second gate electrode GE2 may be substantially the same as the first metal pattern WF1, the second metal pattern WF2, and the electrode pattern EL of the first gate electrode GE1 described above.

The second gate insulating layer GI2 may include a dipole element. The dipole element may include at least one of lanthanum (La), aluminum (Al), or combinations thereof. In other words, the second gate insulating layer GI2 may contain at least one of lanthanum (La), aluminum (Al), or combinations thereof as its impurity. In an embodiment, the second gate insulating layer GI2 may contain lanthanum (La) as the dipole element.

The second gate insulating layer GI2 may include a dipole-interface, which is formed near the high-k dielectric layer HK or the interface layer IL by the dipole element. In the case where the second gate insulating layer GI2 contains lanthanum (La), an effective work function of the second gate electrode GE2 may be reduced. As a result, a threshold voltage of the first pull-down transistor TD1, which is an NMOS transistor, may be lowered.

Figure 7:
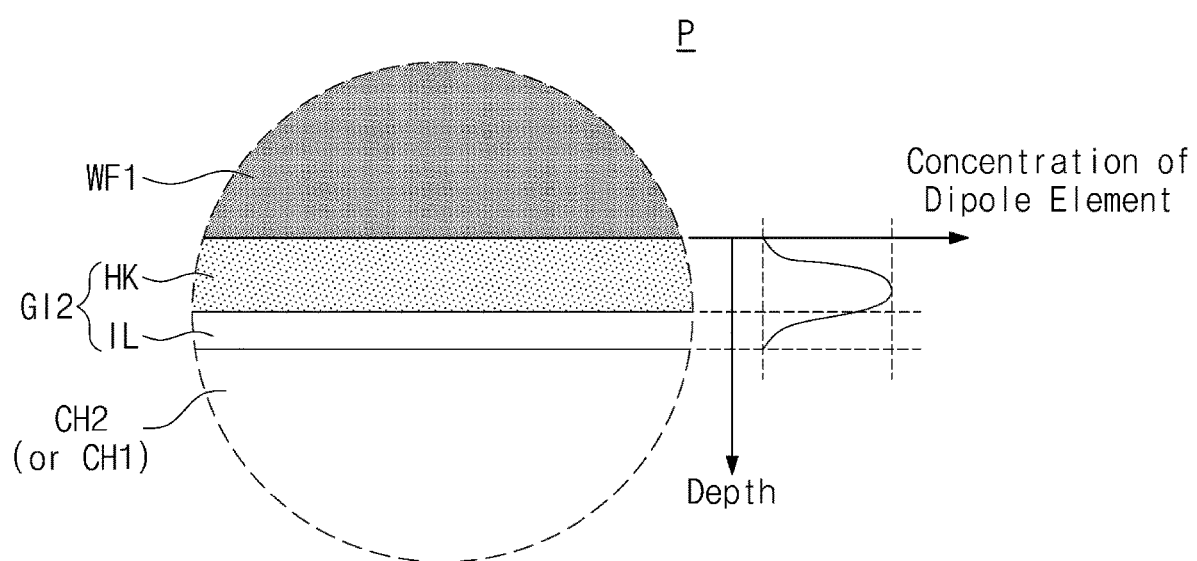
FIG. 7 is an enlarged sectional view of a portion P of FIG. 6B.

FIG. 7 is an enlarged sectional view of a portion P of FIG. 6B. FIG. 7 illustrates a concentration profile of the dipole element in the second gate insulating layer GI2. Referring to FIG. 7, the concentration of the dipole element may be increased until it reaches its highest value, when it is measured along a path from an interface between the first metal pattern WF1 and the high-k dielectric layer HK toward the interface layer IL, and then, may be decreased when it is measured along a path toward an interface between the interface layer IL and the second channel pattern CH2.

Meanwhile, the first gate insulating layer GI1 of FIG. 6A may not include the dipole element. In other words, the highest concentration of the dipole element in the first gate insulating layer GI1 may be lower than the highest concentration of the dipole element in the second gate insulating layer GI2.

The gate of the first pass-gate transistor TA1 of FIG. 6A and the gate of the first pull-down transistor TD1 of FIG. 6B may both be gates of NMOS transistors, and the first gate electrode GE1 and the second gate electrode GE2 may have the same structure. However, the gate of the first pull-down transistor TD1 of FIG. 6B may contain the dipole element, whereas the gate of the first pass-gate transistor TA1 of FIG. 6A may not contain the dipole element. Due to a difference in the presence or concentration between the dipole elements in the first pull-down and pass-gate transistors TD1 and TA1, threshold voltages of the first pull-down and pass-gate transistors TD1 and TA1 may be different from each other.

For example, the threshold voltage of the gate of the first pull-down transistor TD1, which contains lanthanum (La), may be smaller than the threshold voltage of the gate of the first pass-gate transistor TA1, which does not contain lanthanum (La). Since the threshold voltage of the gate of the first pass-gate transistor TA1 is greater than the threshold voltage of the gate of the first pull-down transistor TD1, an operation speed of the first pass-gate transistor TA1 may be slower than an operation speed of the first pull-down transistor TD1. In other words, by using the dipole element, the operation speed of the first pass-gate transistor TA1 may be controlled to be slower than the operation speed of the first pull-down transistor TD1.

During the read operation of the SRAM cell, a read current may be supplied to the first pull-down transistor TD1 through the first pass-gate transistor TA1. The first bit line BL1 may be pre-charged to the voltage of VDD, and thus, the first pass-gate transistor TA1 may be operated in a saturation mode in a Vg-Id curve. By contrast, the first pull-down transistor TD1 may be operated in a linear mode. Here, in the case where the first pass-gate transistor TA1 and the first pull-down transistor TD1 have the same driving force, a voltage of the first node N1 may be increased, and in this case, there may be a disturb fail.

According to an embodiment of the disclosure, by using the dipole element, the driving force of the first pass-gate transistor TA1 may be controlled to be smaller than the driving force of the first pull-down transistor TD1. Thus, it may be possible to prevent a voltage of the first node N1 from being elevated in the read operation and thereby to improve characteristics of the read operation of the SRAM cell.

Referring to FIG. 6C, the second gate electrode GE2 on the first channel pattern CH1 may be the gate of the first pull-up transistor TU1 that is a PMOS transistor. The second gate insulating layer GI2 may be interposed between the second gate electrode GE2 and the first channel pattern CH1. The second gate insulating layer GI2 may include the interface layer IL, which is provided to directly cover the surface of the second channel pattern CH2, and the high-k dielectric layer HK, which is provided on the interface layer IL.

The second gate electrode GE2 may include the first metal pattern WF1, the second metal pattern WF2, and the electrode pattern EL. A thickness of the first metal pattern WF1 of the first pull-up transistor TU1 may be smaller than the thickness of the first metal pattern WF1 of the first pull-down transistor TD1 described with reference to FIG. 6B. This is because the first pull-up transistor TU1, which is the PMOS transistor, should have an effective work function greater than that of the first pull-down transistor TD1, which is the NMOS transistor.

The second gate insulating layer GI2 of the first pull-up transistor TU1 may be substantially the same as the second gate insulating layer GI2 previously described with reference to FIGS. 6B and 7. In other words, the second gate insulating layer GI2 of the first pull-up transistor TU1 may also contain the dipole element (e.g., lanthanum (La)).

The lanthanum (La), which is contained as the dipole element in the first pull-up transistor TU1, may reduce the effective work function of the second gate electrode GE2, and thus, it may increase a threshold voltage of the first pull-up transistor TU1, which is the PMOS transistor. In other words, the dipole element may be used to control the first pull-up transistor TU1 such that the first pull-up transistor TU1 has a reduced operation speed and a reduced driving force.

Both of the first pull-up transistor TU1 and the first pull-down transistor TD1 may contain dipole elements. However, since the first pull-up transistor TU1 and the first pull-down transistor TD1 are PMOS and NMOS, respectively, an absolute value of the threshold voltage of the first pull-up transistor TU1 may be greater than an absolute value of the threshold voltage of the first pull-down transistor TD1.

As described above, the first pass-gate transistor TA1 may have a relatively small driving force. In this case, characteristics of a write operation of the SRAM cell may be deteriorated. However, according to the present embodiment, since the first pull-up transistor TU1 contains the dipole element, the driving force of the first pull-up transistor TU1 may become relatively weak. Accordingly, the characteristics of the write operation of the SRAM cell may be improved.

According to an embodiment of the disclosure, it may be possible to reduce a minimum voltage (Vmin) of the SRAM cell. In addition, it may be possible to reduce a standby leakage, because the dipole element prevents or suppresses a leakage current.

The second pass-gate transistor TA2, the second pull-down transistor TD2, and the second pull-up transistor TU2 of the SRAM cell may be configured to have substantially the same features as the first pass-gate transistor TA1, the first pull-down transistor TD1, and the first pull-up transistor TU1 previously described with reference to FIGS. 6A to 6C.

In an embodiment, the first gate insulating layer GI1 of the first pass-gate transistor TA1 may contain a first dipole element, and the second gate insulating layer GI2 of the first pull-down transistor TD1 may contain a second dipole element. The first dipole element may be different from the second dipole element. For example, the first dipole element may be aluminum (Al), and the second dipole element may be lanthanum (La). The aluminum (Al) serving as the first dipole element may lead to an increase in an effective work function of the gate of the first pass-gate transistor TA1. By contrast, the lanthanum (La) serving as the second dipole element may lead to a reduction in the effective work function of the gate of the first pull-down transistor TD1.

Since both of the first pass-gate transistor TA1 and the first pull-down transistor TD1 are NMOS transistors, the threshold voltage of the first pass-gate transistor TA1 may be increased by the first dipole element, and the threshold voltage of the first pull-down transistor TD1 may be reduced by the second dipole element. As a result, it may be possible to increase a difference between the driving forces of the first pass-gate transistor TA1 and the first pull-down transistor TD1.

In another embodiment, the second gate insulating layer GI2 of the first pull-up transistor TU1 may not contain the dipole element. In other words, the first pass-gate transistor TA1 and the first pull-up transistor TU1 may not contain the dipole element and only the first pull-down transistor TD1 may contain the dipole element. In this case, it may be possible to improve characteristics of the read operation of the SRAM cell.

In other embodiment, the semiconductor memory device previously described with reference to FIGS. 2 to 6C may include a negative capacitance (NC) FET using a negative capacitor. For example, the gate insulating layer GI may include a ferroelectric layer having a ferroelectric material property and a paraelectric layer having a paraelectric material property.

The ferroelectric layer may have a negative capacitance, and the paraelectric layer may have a positive capacitance. In the case where two or more capacitors are connected in series and each capacitor has a positive capacitance, a total capacitance may be less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS) less than 60 mV/decade, at room temperature.

The ferroelectric layer may have a ferroelectric material property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be one of compounds composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have a paraelectric material property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the disclosure is not limited to these examples.

The ferroelectric layer and the paraelectric layer may be formed of or include the same material. The ferroelectric layer may have the ferroelectric material property, but the paraelectric layer may not have the ferroelectric material property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric material property, only when it is in a specific range of thickness. In an embodiment, the ferroelectric layer may have a thickness ranging from 0.5 to 10 nm, but the disclosure is not limited to this example. Since a critical thickness associated with the occurrence of the ferroelectric material property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Figure 8A:
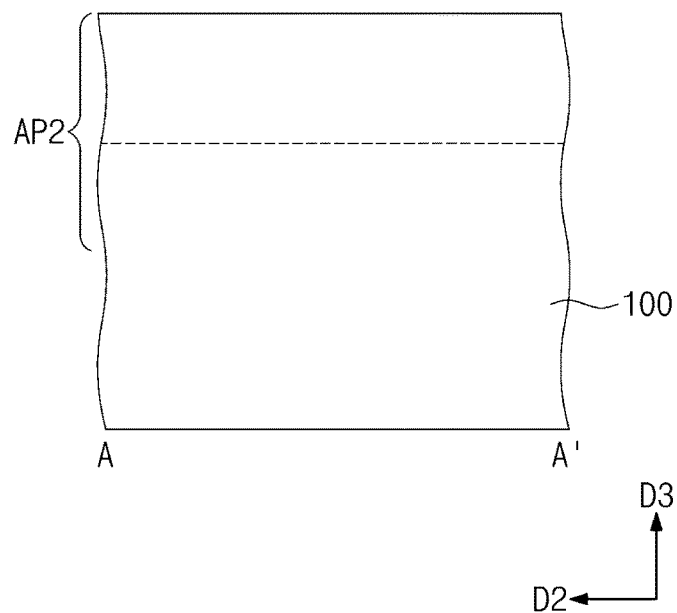
FIGS. 8A to 10D are sectional views illustrating a method of fabricating a semiconductor memory device, according to an embodiment of the disclosure
Figure 10A:
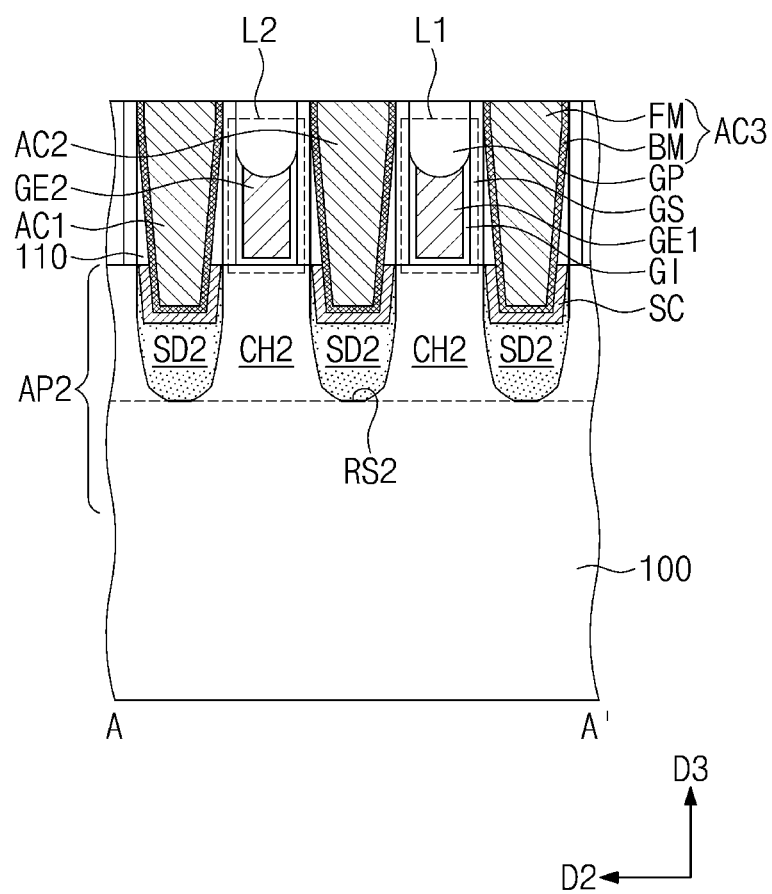
Figure 10B:
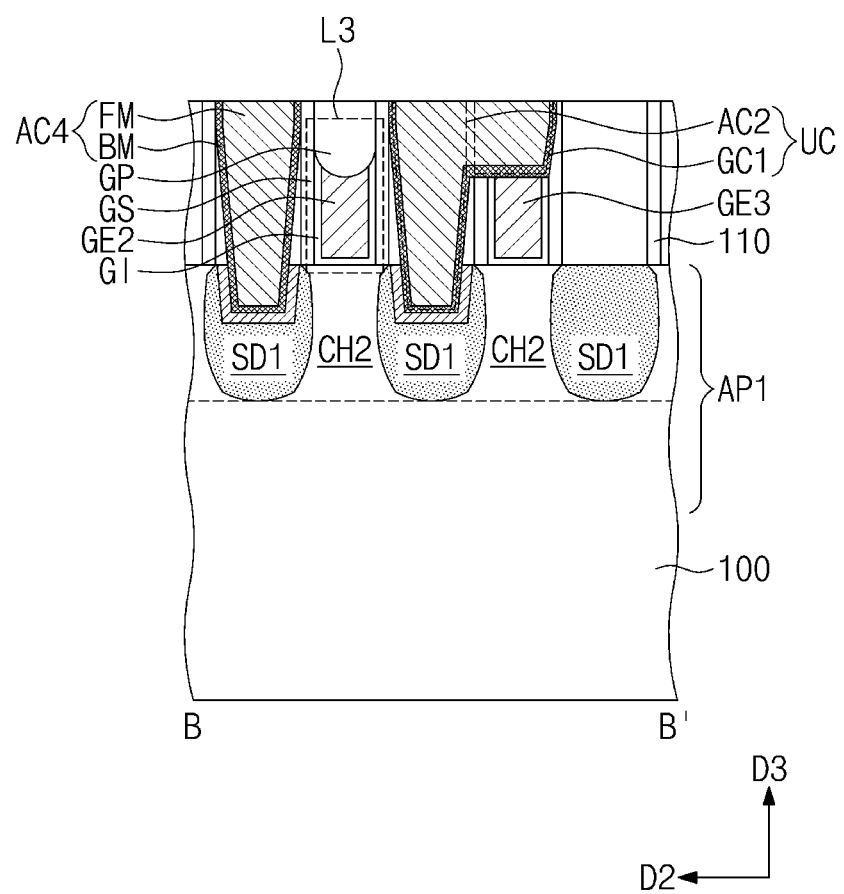
Figure 10C:
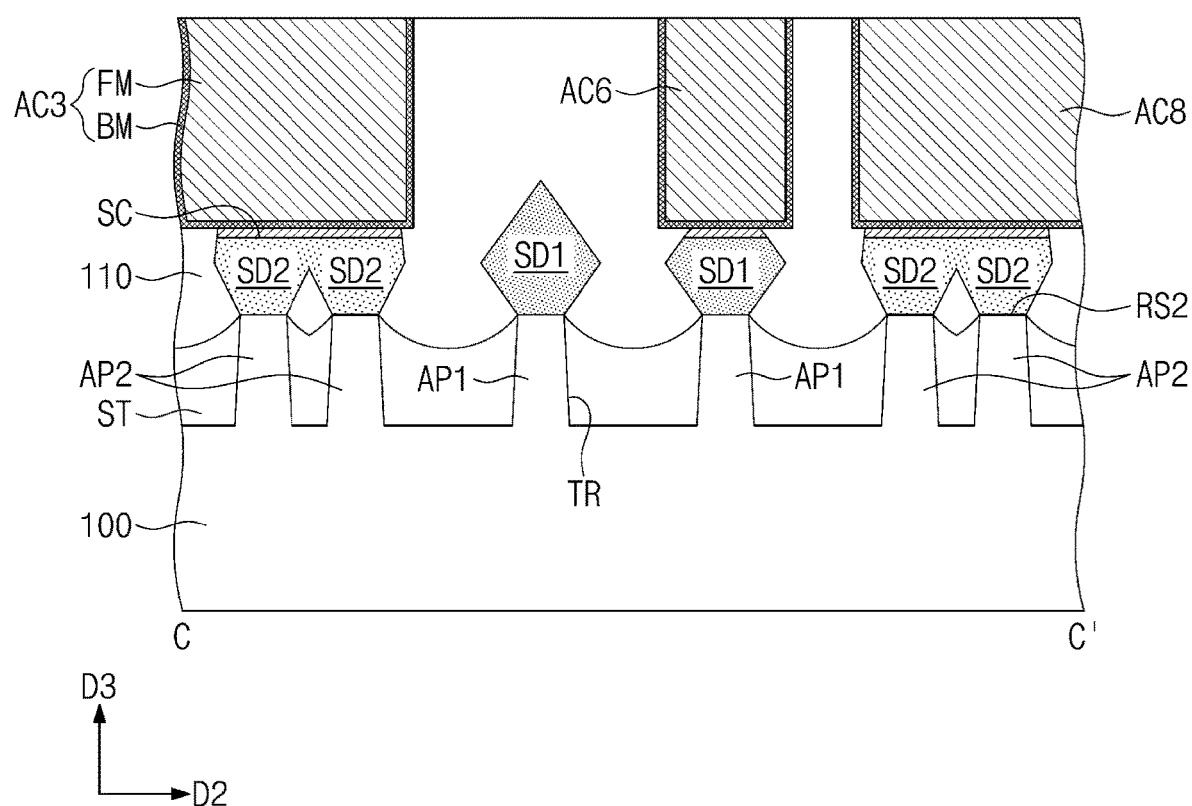
Figure 10D:
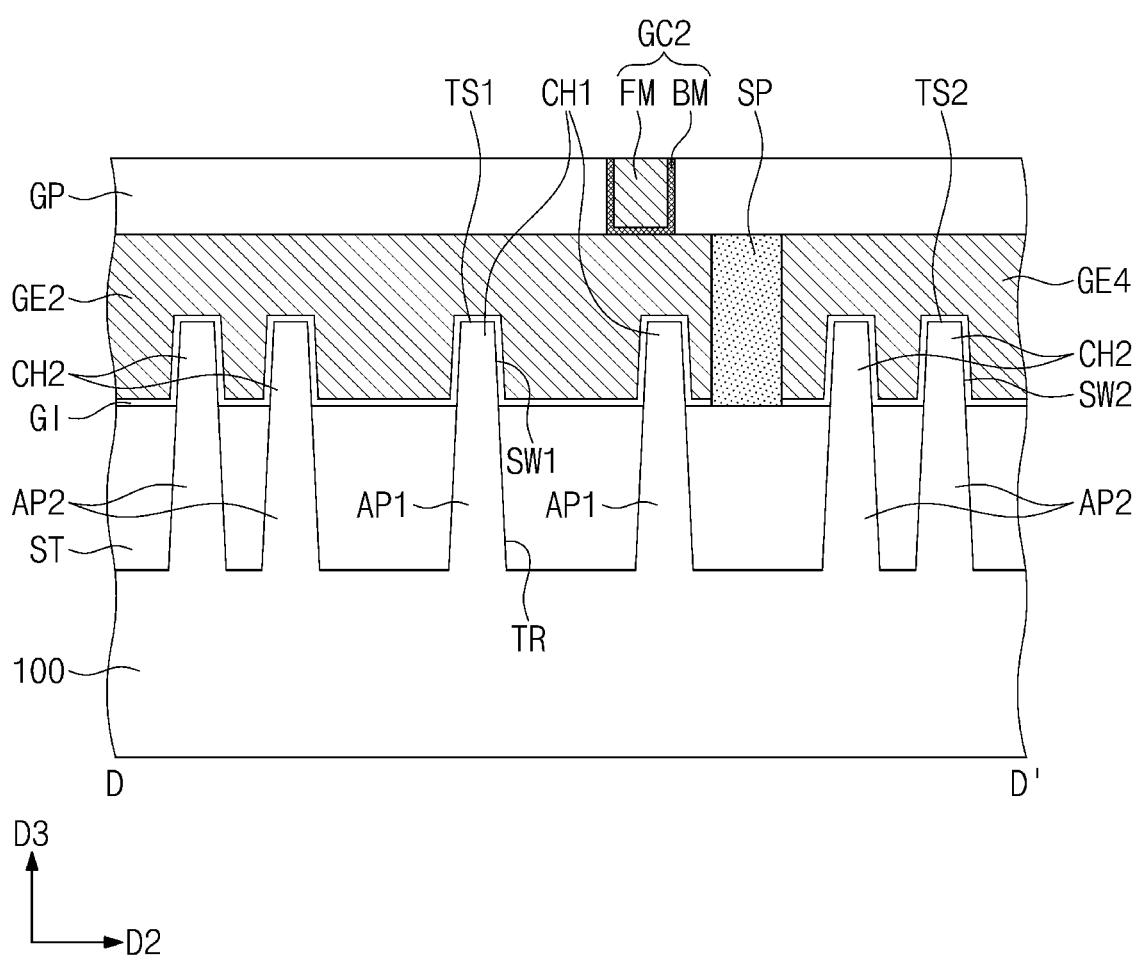

FIGS. 8A to 10D are sectional views illustrating a method of fabricating a semiconductor memory device, according to an embodiment of the disclosure. FIGS. 8A, 9A, and 10A are sectional views taken along the line A-A' of FIG. 4. FIGS. 9B and 10B are sectional views taken along the line B-B' of FIG. 4. FIGS. 9C and 10C are sectional views taken along the line C-C' of FIG. 4. FIGS. 8B, 9D, and 10D are sectional views taken along the line D-D' of FIG. 4.

Figure 8B:
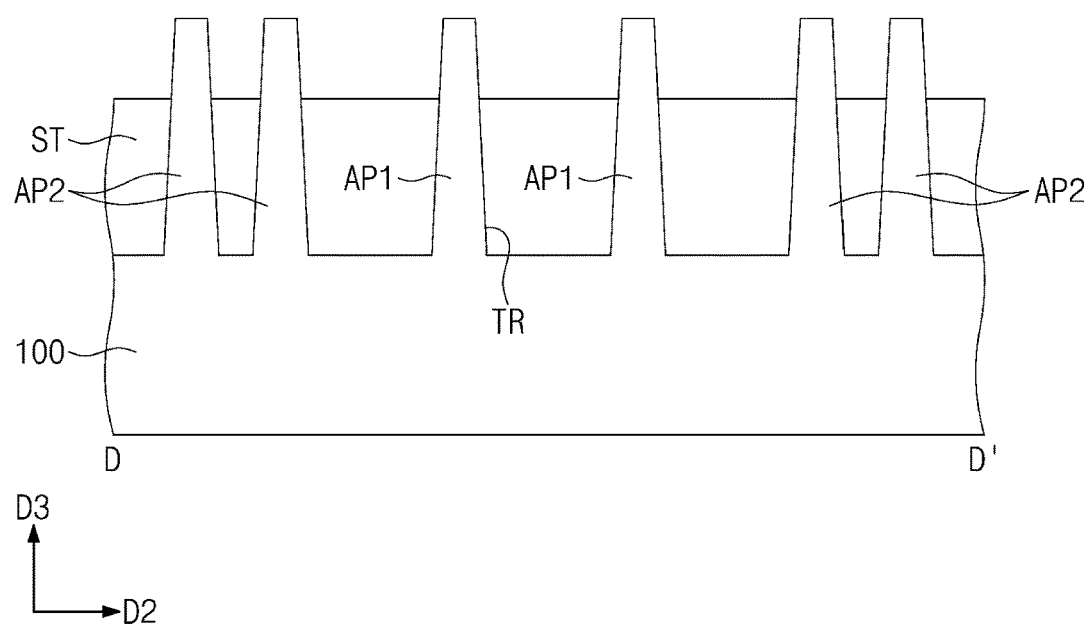
Figure 9A:
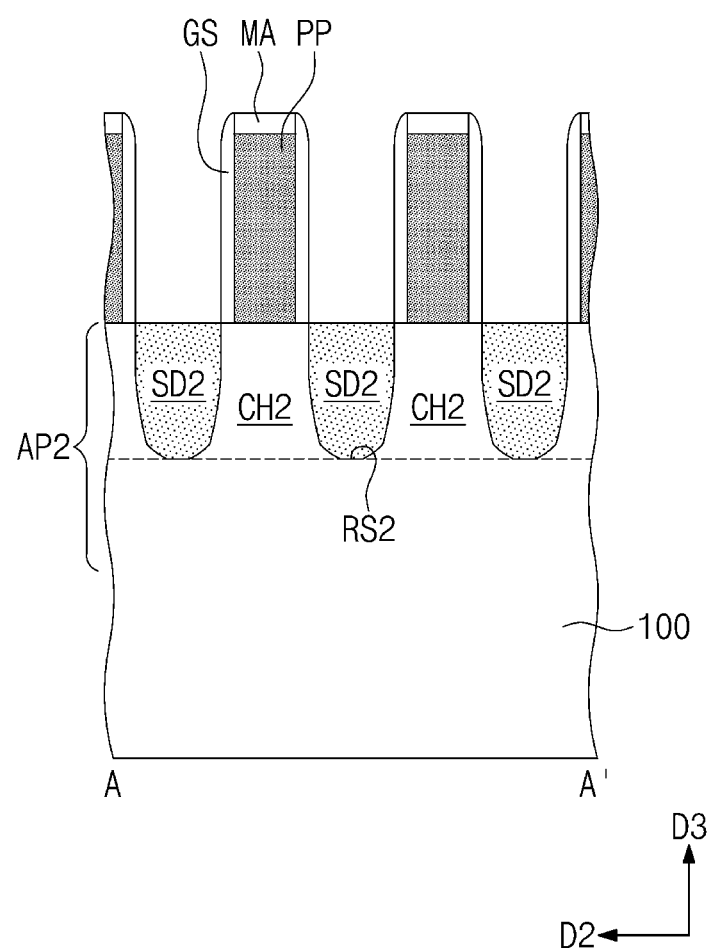
Figure 9B:
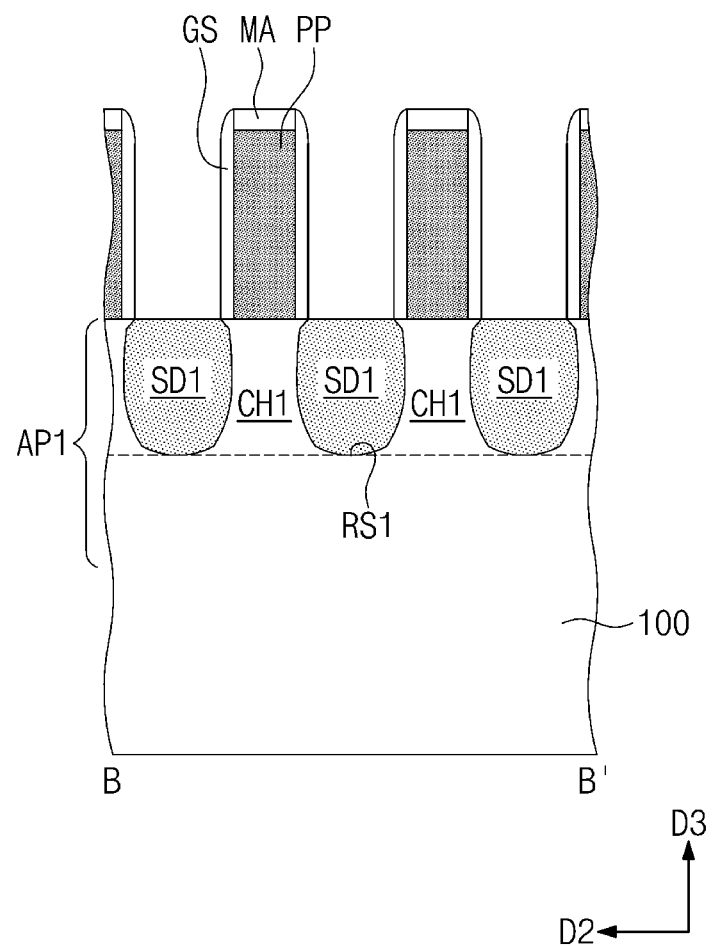
Figure 9C:
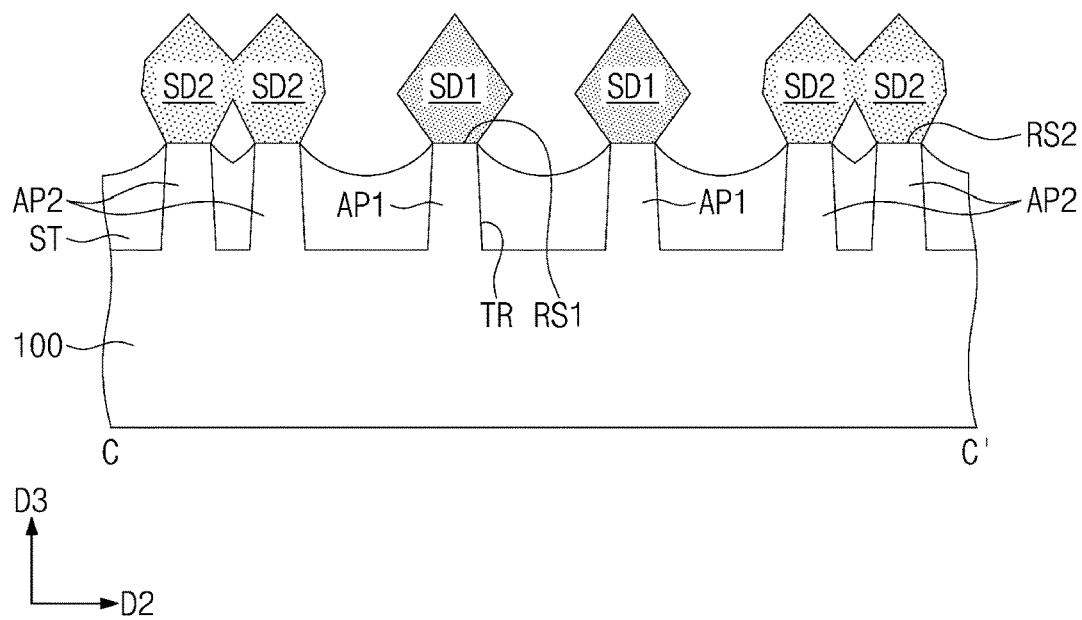
Figure 9D:
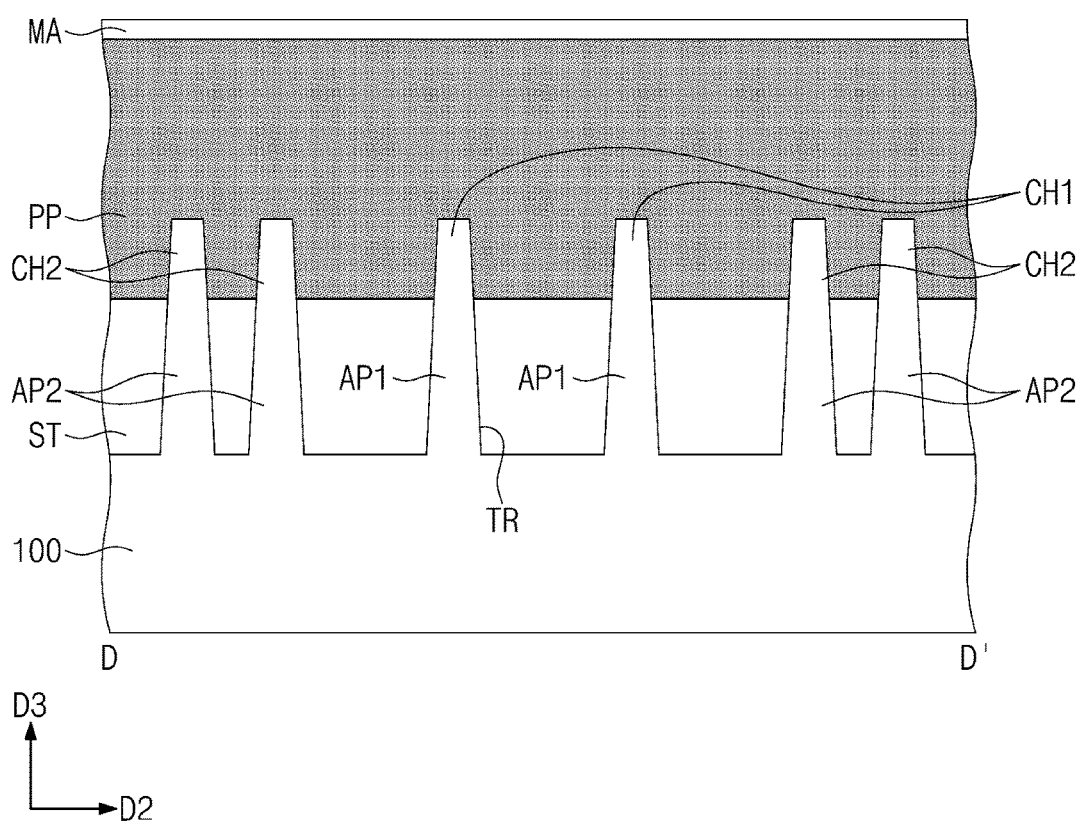

Referring to FIGS. 4, 8A, and 8B, the substrate 100 may be patterned to form trenches TR defining the first and second active patterns AP1 and AP2. In other words, the trenches TR may be formed between the first and second active patterns AP1 and AP2.

The device isolation layer ST may be formed on the substrate 100 to fill the trenches TR. The device isolation layer ST may be formed of or include at least one of insulating materials (e.g., silicon oxide). The device isolation layer ST may be recessed to expose upper portions of the first and second active patterns AP1 and AP2. Thus, the upper portions of the first and second active patterns AP1 and AP2 may vertically protrude above the device isolation layer ST.

Referring to FIGS. 4 and 9A to 9D, sacrificial patterns PP may be formed to cross the first and second active patterns AP1 and AP2. The sacrificial patterns PP may be line-shaped patterns extending in the first direction D1. In detail, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may be formed of or include poly silicon.

A pair of the gate spacers GS may be formed on both side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. Alternatively, the gate spacer layer may be a multi-layered structure including at least two of SiCN, SiCON, or SiN.

The first source/drain patterns SD1 may be formed in an upper portion of the first active pattern AP1. A pair of the first source/drain patterns SD1 may be formed at both sides of each of the sacrificial patterns PP. In detail, first recess regions RS1 may be formed by etching upper portions of the first active pattern AP1 using hard mask patterns MA and the gate spacers GS as an etch mask. The device isolation layer ST between the first active patterns AP1 may be recessed, during the etching of the upper portion of the first active pattern AP1.

The first source/drain pattern SD1 may be formed by performing a selective epitaxial growth process using an inner surface of the first recess region RS1 of the first active pattern AP1 as a seed layer. As a result of the formation of the first source/drain patterns SD1, the first channel pattern CH1 may be defined between each pair of the first source/drain patterns SD1. As an example, the first source/drain patterns SD1 may be formed of or include a semiconductor material (e.g., SiGe) whose lattice constant is greater than that of a semiconductor material of the substrate 100. Each of the first source/drain patterns SD1 may be a multi-layered structure including a plurality of semiconductor layers.

In an embodiment, during the selective epitaxial growth process, the first source/drain patterns SD1 may be doped in-situ with impurities. In another embodiment, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed in an upper portion of the second active pattern AP2. A pair of the second source/drain patterns SD2 may be formed at both sides of each of the sacrificial patterns PP. In detail, second recess regions RS2 may be formed by etching the upper portion of the second active pattern AP2 using the hard mask patterns MA and the gate spacers GS as an etch mask.

The second source/drain pattern SD2 may be formed by performing a selective epitaxial growth process using an inner surface of the second recess region RS2 of the second active pattern AP2 as a seed layer, may be performed to form. As a result of the formation of the second source/drain patterns SD2, the second channel pattern CH2 may be defined between each pair of the second source/drain patterns SD2. In an embodiment, the second source/drain patterns SD2 may be formed of or include the same semiconductor material (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. In other words, the first source/drain patterns SD1 and the second source/drain patterns SD2 may not be formed at the same time.

Referring to FIGS. 4 and 10A to 10D, the first interlayer insulating layer 110 may be formed to cover the first and second source/drain patterns SD1 and SD2, the hard mask patterns MA, and the gate spacers GS. As an example, the first interlayer insulating layer 110 may include a silicon oxide layer.

The first interlayer insulating layer 110 may be planarized to expose top surfaces of the sacrificial patterns PP. The planarization of the first interlayer insulating layer 110 may be performed using an etch-back or chemical mechanical polishing (CMP) process. All of the hard mask patterns MA may be removed during the planarization process. As a result, the first interlayer insulating layer 110 may have a top surface that is substantially coplanar with the top surfaces of the sacrificial patterns PP and the top surfaces of the gate spacers GS.

The sacrificial patterns PP may be replaced with the first to fourth gate electrodes GE1-GE4. For example, the exposed sacrificial patterns PP may be selectively removed. Empty spaces (e.g., see ET1, ET2, and ET3 of FIGS. 11, 12, and 13) may be formed as a result of the removal of the sacrificial patterns PP. The gate insulating layer GI, the gate electrode GE1-GE4, and the gate capping pattern GP may be formed in the empty space, which is formed by the removal of the sacrificial pattern PP.

The insulating pattern SP may be formed by removing a portion of the gate electrode GE1-GE4 and filling the removed region with an insulating material. The gate electrode GE1-GE4 may be divided into the first to fourth gate electrodes GE1, GE2, GE3, and GE4 by the insulating pattern SP.

The first to eighth active contacts AC1-AC8 may be formed to penetrate the first interlayer insulating layer 110 and to be electrically connected to the first and second source/drain patterns SD1 and SD2. The first and second gate contacts GC1 and GC2 may be formed to penetrate the first interlayer insulating layer 110 and the gate capping pattern GP and to be electrically connected to the second and third gate electrodes GE2 and GE3, respectively.

The active contacts AC1-AC8 and the gate contacts GC1 and GC2 may be simultaneously formed through a middle-of-line (MOL) process. For example, first contact holes may be formed in the first interlayer insulating layer 110 through a first photolithography process. The first contact holes may define the active contacts AC1-AC8. The first contact holes may be formed to expose the first and second source/drain patterns SD1 and SD2. The first contact holes may be formed in a self-aligned manner using the gate spacers GS and the gate capping patterns GP as a mask.

Second contact holes may be formed through a second photolithography process. The second contact holes may define the gate contacts GC1 and GC2. The second contact holes may be formed to expose the top surfaces of the second and third gate electrodes GE2 and GE3.

For example, a portion of the first contact hole defining the second active contact AC2 may be overlapped with a portion of the second contact hole defining the first gate contact GC1. In other words, the first and second contact holes, which are overlapped with each other, may form a single contact hole.

The active contacts AC1-AC8 and the gate contacts GC1 and GC2 may be formed by filling the first and second contact holes with a barrier layer and a conductive layer sequentially. For example, the second active contact AC2 and the first gate contact GC1 may constitute a single contact structure UC. The silicide patterns SC may be formed on the first and second source/drain patterns SD1 and SD2 exposed through the first contact holes.

Referring back to FIGS. 4 and 5A to 5D, second to fourth interlayer insulating layers 120, 130, and 140 may be sequentially formed on the first interlayer insulating layer 110. A back-end-of-line (BEOL) process may be performed to form the first interconnection layer M1 in the second interlayer insulating layer 120, to form the second interconnection layer M2 in the third interlayer insulating layer 130, and to form the third interconnection layer M3 in the fourth interlayer insulating layer 140.

Figure 13:
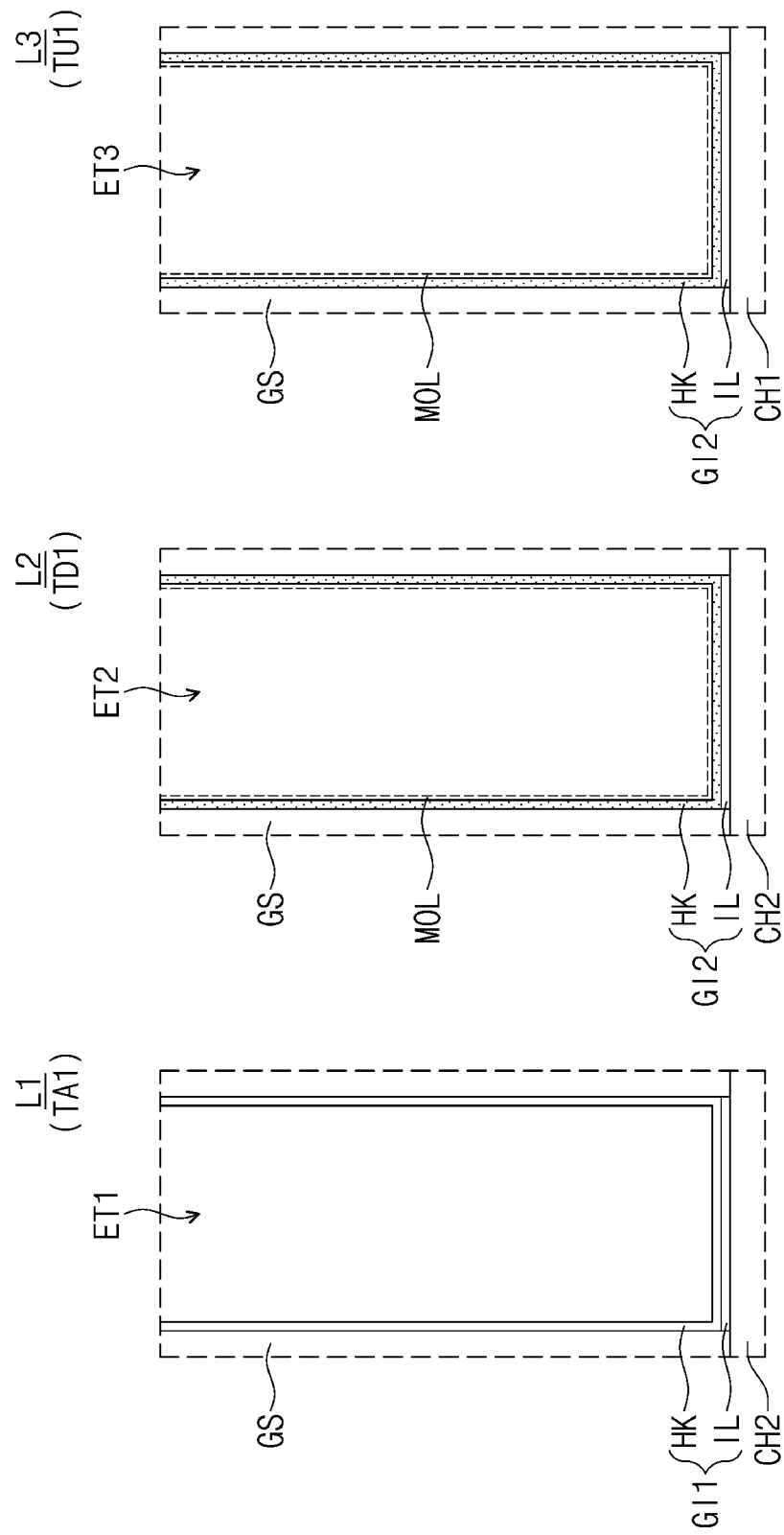
Figure 14:
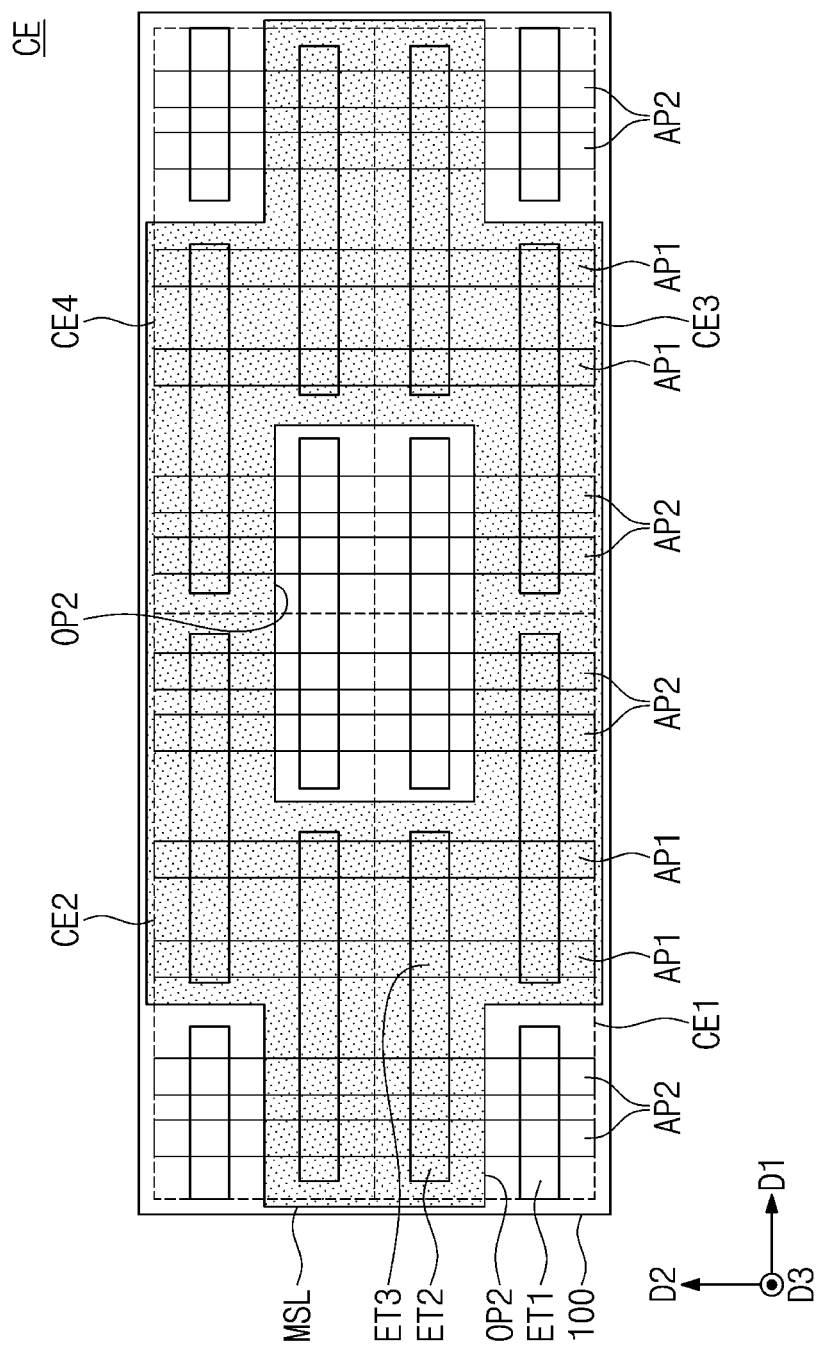
FIG. 14 is a plan view of a mask layer of FIG. 12.

FIGS. 11, 12, and 13 are sectional views illustrating a process of forming the gates of the first pass-gate transistor, the first pull-down transistor, and the first pull-up transistor, according to an embodiment of the disclosure. In detail, FIGS. 11, 12, and 13 are sectional views illustrating a method of forming portions L1, L2, and L3, respectively, of FIGS. 10A and 10B. FIG. 14 is a plan view of a mask layer of FIG. 12.

Referring to FIG. 11, as the sacrificial patterns PP are removed, empty spaces ET1-ET3 may be formed to expose the first and second channel patterns CH1 and CH2. In detail, the empty spaces ET1-ET3 may include a first empty space ET1 exposing the second channel pattern CH2 of the first pass-gate transistor TA1, a second empty space ET2 exposing the second channel pattern CH2 of the first pull-down transistor TD1, and a third empty space ET3 exposing the first channel pattern CH1 of the first pull-up transistor TU1.

The interface layer IL and the high-k dielectric layer HK may be formed in the first to third empty spaces ET1, ET2, and ET3. The formation of the interface layer IL may include oxidizing exposed surfaces of the channel pattern CH1 or CH2. In an embodiment, the high-k dielectric layer HK may be formed by a deposition process (e.g., a CVD or ALD process).

A metal oxide layer MOL may be conformally formed in the first to third empty spaces ET1, ET2, and ET3. The metal oxide layer MOL may include a dipole element. For example, the metal oxide layer MOL may include a lanthanum oxide layer. The metal oxide layer MOL may be formed to have a thickness that is equal to or smaller than the high-k dielectric layer HK.

Referring to FIGS. 12 and 14, a mask layer MSL may be formed to fill the second and third empty spaces ET2 and ET3 but to expose the first empty space ET1. In detail, referring back to FIG. 14, the mask layer MSL may be formed on the memory cell CE to have a second opening OP2 exposing a region for the pass-gate transistor, which is the NMOS transistor. The mask layer MSL may be formed on the memory cell CE to cover regions for the pull-up and pull-down transistors.

The metal oxide layer MOL, which is exposed through the second opening OP2, may be selectively removed using the mask layer MSL as a mask. For example, the metal oxide layer MOL may be selectively removed from the first empty space ET1 of the first pass-gate transistor TA1. Meanwhile, the metal oxide layer MOL in the second and third empty spaces ET2 and ET3 may be protected by the mask layer MSL and may not be removed.

Referring to FIG. 13, the mask layer MSL may be selectively removed. A thermal treatment process may be performed such that the dipole element in the metal oxide layer MOL is diffused into the high-k dielectric layer HK.

Since the metal oxide layer MOL is removed from the first empty space ET1, the high-k dielectric layer HK in the first empty space ET1 may not contain the dipole element, and thus, the first gate insulating layer GI1 which does not contain the dipole element, may be formed in the first empty space ET1.

Since the metal oxide layer MOL is left in the second and third empty spaces ET2 and ET3, the high-k dielectric layer HK in the second and third empty spaces ET2 and ET3 may contain the dipole element, and thus, the second gate insulating layer GI2 containing the dipole element may be formed in the second and third empty spaces ET2 and ET3.

Referring back to FIGS. 6A to 6C, the first metal pattern WF1, the second metal pattern WF2, and the electrode pattern EL may be sequentially formed in the first to third empty spaces ET1, ET2, and ET3.

In the method of fabricating a semiconductor memory device according to an embodiment of the disclosure, even by using the mask layer having a simple shape shown in FIG. 14, it may be possible to allow only desired transistors to contain the dipole element. That is, it may be possible to easily control a difference in threshold voltage between transistors.

Figure 15A:
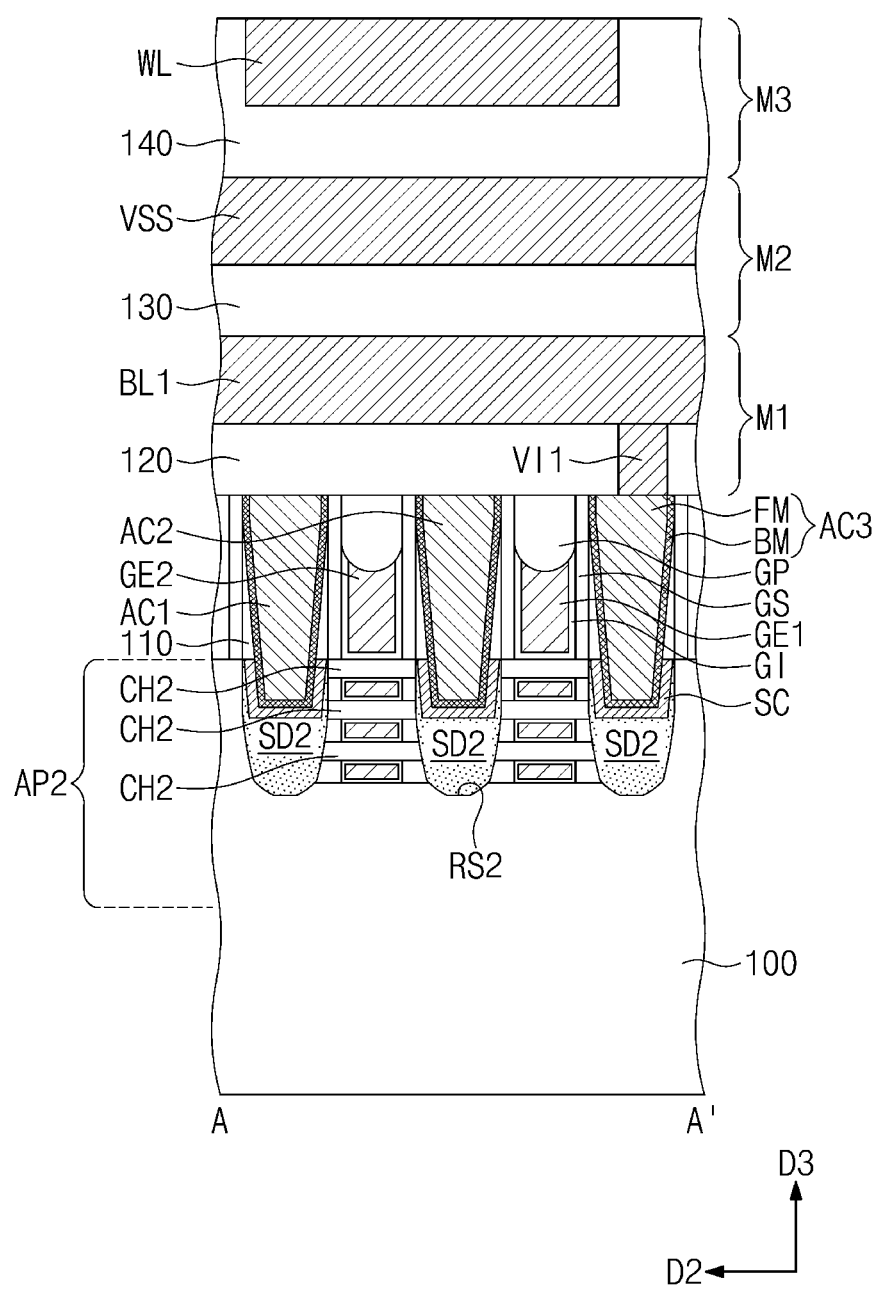
FIGS. 15A and 15B are sectional views, which are taken along the lines A-A' and B-B', respectively, of FIG. 4 to illustrate a semiconductor memory device according to an embodiment of the disclosure.
Figure 15B:
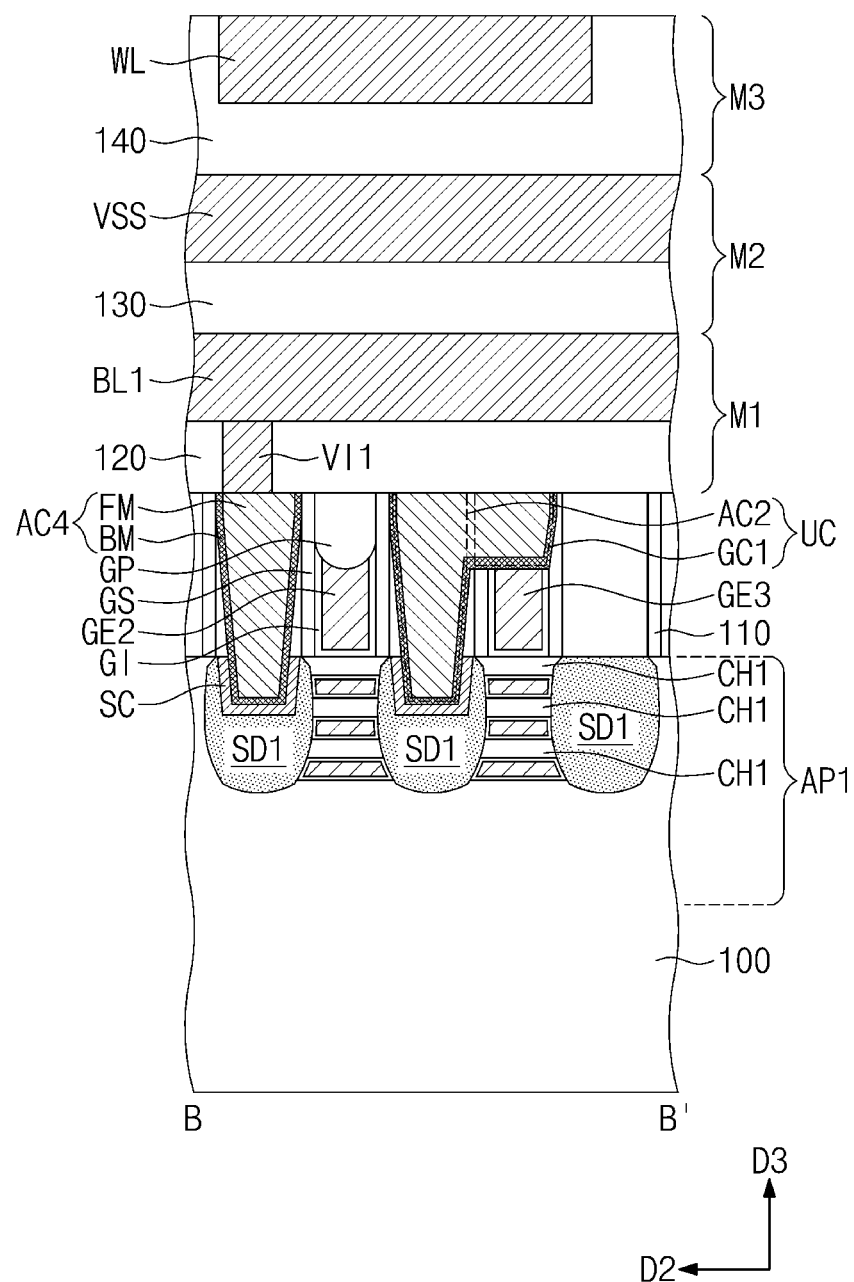

FIGS. 15A and 15B are sectional views, which are taken along the lines A-A' and B-B', respectively, of FIG. 4 to illustrate a semiconductor memory device according to an embodiment of the disclosure. In the following description, an element previously described with reference to FIGS. 4 and 5A to 5D may be identified by the same reference number without repeating an overlapping description thereof.

Referring to FIGS. 4, 15A, and 15B, the first and second active patterns AP1 and AP2 may be provided on the substrate 100. The first active pattern AP1 may include the first channel patterns CH1, which are vertically stacked. The stacked first channel patterns CH1 may be spaced apart from each other in a third direction D3. The stacked first channel patterns CH1 may be vertically overlapped with each other. The second active pattern AP2 may include the second channel patterns CH2, which are vertically stacked. The stacked second channel patterns CH2 may be spaced apart from each other in the third direction D3. The stacked second channel patterns CH2 may be vertically overlapped with each other. The first and second channel patterns CH1 and CH2 may be formed of or include at least one of silicon (Si), germanium (Ge), or silicon-germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect the adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect the adjacent pair of the second source/drain patterns SD2 to each other.

The gate electrodes GE1-GE4 may be provided to cross the first and second channel patterns CH1 and CH2 and to extend in the first direction D1. Each of the gate electrodes GE1-GE4 may be vertically overlapped with the first and second channel patterns CH1 and CH2.

The gate electrode GE1-GE4 may surround each of the first and second channel patterns CH1 and CH2. The transistor according to the present embodiment may be a three-dimensional field-effect transistor (e.g., MBCFET or GAAFET), in which the gate electrode GE1-GE4 is provided to three-dimensionally surround the channel patterns CH1 and CH2.

The gate insulating layer GI may be provided between each of the first and second channel patterns CH1 and CH2 and the gate electrode GE1-GE4. The gate insulating layer GI may enclose each of the first and second channel patterns CH1 and CH2.

On the second active pattern AP2, an insulating pattern IP may be interposed between the gate insulating layer GI and the second source/drain pattern SD2. The gate electrode GE may be spaced apart from the second source/drain pattern SD2 by the gate insulating layer GI and the insulating pattern IP. By contrast, the insulating pattern IP on the first active pattern AP1 may be omitted.

In a semiconductor memory device according to an embodiment of the disclosure, a dipole element may be used to realize a difference in threshold voltage between transistors of an SRAM cell. This may make it possible to improve characteristics of the SRAM cell in both of read and write operations. In addition, the minimum voltage (Vmin) of the SRAM cell may be reduced, and a standby leakage of the SRAM cell may be reduced. Furthermore, it may be possible to easily fabricate the semiconductor memory device, using a mask layer of a simple shape.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While example embodiments of the disclosure have been particularly shown and described, it will be understood by one of ordinary skill in the art that variations in form and detail may be made therein without departing from the spirit and scope of the attached claims.

What is claimed is:

1. A semiconductor memory device comprising:
a static random access memory (SRAM) cell including a pass-gate transistor, a pull-down transistor, and a pull-up transistor that are on a substrate, wherein
each of the pass-gate transistor, the pull-down transistor, and the pull-up transistor comprises:
an active fin protruding above a device isolation layer;
a gate electrode on the active fin; and
a gate insulating layer between the active fin and the gate electrode,
the gate insulating layer of the pull-down transistor comprises a first dipole element, and
a highest concentration of the first dipole element of the gate insulating layer of the pull-down transistor is higher than a highest concentration of the first dipole element of the gate insulating layer of the pass-gate transistor.

2. The semiconductor memory device of claim 1, wherein the first dipole element decreases an effective work function of the gate electrode.

3. The semiconductor memory device of claim 2, wherein:
the gate insulating layer of the pass-gate transistor comprises a second dipole element, and
the second dipole element increases the effective work function of the gate electrode.

4. The semiconductor memory device of claim 1, wherein:
the gate electrode comprises a first metal pattern, a second metal pattern on the first metal pattern, and an electrode pattern on the second metal pattern,
the first metal pattern comprises a metal nitride,
the second metal pattern comprises a metal carbide, and
a thickness of the first metal pattern of the gate electrode of the pull-up transistor is larger than a thickness of the first metal pattern of the gate electrode of the pull-down transistor.

5. The semiconductor memory device of claim 1, wherein the gate electrode of the pass-gate transistor has substantially a same structure as the gate electrode of the pull-down transistor.

6. The semiconductor memory device of claim 1, wherein a threshold voltage of the pass-gate transistor is greater than a threshold voltage of the pull-down transistor.

7. The semiconductor memory device of claim 6, wherein a threshold voltage of the pull-up transistor is greater than the threshold voltage of the pull-down transistor.

8. The semiconductor memory device of claim 1, wherein:
the gate insulating layer of the pull-down transistor comprises an interface layer covering a surface of the active fin and a high-k dielectric layer on the interface layer, and
a concentration of the first dipole element is increased until it reaches its highest value, when it is measured along a path from an interface between the gate electrode and the high-k dielectric layer toward the interface layer, and then, is decreased when it is measured along a path toward an interface between the interface layer and the active fin.

9. A semiconductor memory device comprising:
an active pattern on a substrate;
a first gate electrode and a second gate electrode provided to cross the active pattern and to extend to be parallel to each other in a first direction;
a source/drain pattern provided on the active pattern and interposed between the first and second gate electrodes;
a first gate insulating layer of a pass-gate transistor between the active pattern and the first gate electrode; and
a second gate insulating layer of a pull-down transistor between the active pattern and the second gate electrode, wherein
the first and second gate electrodes are adjacent to each other in a second direction crossing the first direction,
the source/drain pattern has a conductivity of n-type,
the second gate insulating layer comprises a first dipole element, and
a highest concentration of the first dipole element of the second gate insulating layer of the pull-down transistor is higher than a highest concentration of the first dipole element of the first gate insulating layer of the pass-gate transistor.

10. The semiconductor memory device of claim 9, wherein:
the first gate insulating layer comprises a second dipole element,
the first dipole element decreases an effective work function of the second gate electrode, and
the second dipole element increases an effective work function of the first gate electrode.

11. The semiconductor memory device of claim 9, further comprising:
a plurality of interconnection layers stacked on the substrate, wherein:
at least one of the interconnection layers comprises a word line, and
the first gate electrode is electrically connected to the word line.

12. The semiconductor memory device of claim 9, wherein the active pattern comprises an active fin protruding above a device isolation layer or comprises a plurality of vertically-stacked channel patterns.

13. A semiconductor memory device comprising:
a substrate including a bit cell region;
a first active pattern and a second active pattern on the bit cell region, the first active pattern being spaced apart from the second active pattern in a first direction;
a device isolation layer provided on the substrate to cover a side surface of a lower portion of each of the first and second active patterns, an upper portion of each of the first and second active patterns protruding above the device isolation layer;
a first gate electrode extended in the first direction to cross the second active pattern;
a second gate electrode extended in the first direction to cross the first and second active patterns;
a first source/drain pattern provided on the first active pattern and adjacent to a side of the second gate electrode;
a second source/drain pattern provided on the second active pattern and interposed between the first and second gate electrodes;
a first gate insulating layer of a pass-gate transistor between the first gate electrode and the second active pattern;
a second gate insulating layer of a pull-down transistor between the second gate electrode and the second active pattern;
a gate spacer on at least one of side surfaces of each of the first and second gate electrodes;
a gate capping pattern on each of the first and second gate electrodes;
an interlayer insulating layer on the gate capping pattern;
an active contact, which is provided to penetrate the interlayer insulating layer, is coupled to the first and second source/drain patterns, and is extended in the first direction to connect the first and second source/drain patterns to each other;
a silicide pattern between the active contact and each of the first and second source/drain patterns; and
a first interconnection layer, a second interconnection layer, and a third interconnection layer sequentially stacked on the interlayer insulating layer, wherein
the second gate insulating layer comprises a dipole element, and
a highest concentration of the dipole element of the second gate insulating layer of the pull-down transistor is higher than a highest concentration of the dipole element of the first gate insulating layer of the pass-gate transistor.

14. The semiconductor memory device of claim 13, wherein:
at least one of the first to third interconnection layers comprises a word line, and
the first gate electrode is electrically connected to the word line.

15. The semiconductor memory device of claim 13, wherein:
the first source/drain pattern has a conductivity of p-type, and
the second source/drain pattern has a conductivity of n-type.

16. The semiconductor memory device of claim 13, wherein the second gate insulating layer is extended in the first direction, along with the second gate electrode, and is interposed between the second gate electrode and the first active pattern.

17. The semiconductor memory device of claim 13, wherein the dipole element decreases an effective work function of the second gate electrode.

* * * * *